US009660061B2

(12) United States Patent
Ohnishi

(10) Patent No.: US 9,660,061 B2
(45) Date of Patent: May 23, 2017

(54) SEMICONDUCTOR DEVICE

(71) Applicant: Renesas Electronics Corporation, Tokyo (JP)

(72) Inventor: Sadayuki Ohnishi, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/001,493

(22) Filed: Jan. 20, 2016

(65) Prior Publication Data

US 2016/0240633 A1    Aug. 18, 2016

(30) Foreign Application Priority Data

Feb. 16, 2015 (JP) ................. 2015-027467

(51) Int. Cl.

| H01L 29/02 | (2006.01) |
|---|---|
| H01L 29/735 | (2006.01) |
| H01L 29/06 | (2006.01) |
| H01L 21/8249 | (2006.01) |
| H01L 27/06 | (2006.01) |

(52) U.S. Cl.
CPC ........ *H01L 29/735* (2013.01); *H01L 21/8249* (2013.01); *H01L 27/0623* (2013.01); *H01L 29/0649* (2013.01)

(58) Field of Classification Search
CPC . H01L 29/735; H01L 23/535; H01L 29/0649; H01L 21/8222; H01L 21/8248; H01L 27/082; H01L 29/66234; H01L 438/317; H01L 29/66242; H01L 29/7375; H01L 29/7378; H01L 29/7371; H01L 27/0605; H01L 29/1608; H01L 438/324
See application file for complete search history.

(56) References Cited

U.S. PATENT DOCUMENTS

| 5,547,893 A * | 8/1996 | Sung ............... H01L 21/8249 |
|---|---|---|
| | | 257/E21.648 |
| 2002/0048873 A1* | 4/2002 | Arai ................ H01L 21/8249 |
| | | 438/202 |

FOREIGN PATENT DOCUMENTS

| JP | 60-103661 A | 6/1985 |
|---|---|---|
| JP | 2007-329317 A | 12/2007 |

* cited by examiner

*Primary Examiner* — Julio J Maldonado
*Assistant Examiner* — Stanetta Isaac
(74) *Attorney, Agent, or Firm* — Mattingly & Malur, PC

(57) ABSTRACT

A p-type well is formed in a semiconductor substrate, and an $n^+$-type semiconductor region and a $p^+$-type semiconductor region are formed in the p-type well to be spaced apart from each other. The $n^+$-type semiconductor region is an emitter semiconductor region of a bipolar transistor, and the p-type well and the $p^+$-type semiconductor region are base semiconductor regions of the bipolar transistor. An electrode is formed on an element isolation region between the $n^+$-type semiconductor region and the $p^+$-type semiconductor region, and at least a part of the electrode is buried in a trench which is formed in the element isolation region. The electrode is electrically connected to the $n^+$-type semiconductor region.

14 Claims, 23 Drawing Sheets

SEMICONDUCTOR DEVICE

CROSS-REFERENCE TO RELATED APPLICATION

The present application claims priority from Japanese Patent Application No. 2015-027467 filed on Feb. 16, 2015, the content of which is hereby incorporated by reference into this application.

TECHNICAL FIELD

The present invention relates to a semiconductor device, and, for example, can be suitably used for a semiconductor device which has a bipolar transistor.

BACKGROUND

A semiconductor device which has a bipolar transistor is manufactured by forming an emitter semiconductor region, a base semiconductor region, and a collector semiconductor region on a semiconductor substrate.

Japanese Patent Application Laid-Open Publication No. 2007-329317 (Patent Document 1) and Japanese Patent Application Laid-Open Publication No. S60-103661 (Patent Document 2) describe techniques relating to a semiconductor device which has a bipolar transistor.

SUMMARY

It is desirable to improve reliability as much as possible also in the semiconductor device which has the bipolar transistor.

Other problems to be solved and novel characteristics will be apparent from the description of the present specification and the accompanying drawings.

According to an embodiment, a semiconductor device is provided with a bipolar transistor. The semiconductor device includes a semiconductor substrate, a first semiconductor region of a first conductivity type which is formed in the semiconductor substrate, a second semiconductor region of the first conductivity type and a third semiconductor region of a second conductivity type which are formed to be spaced apart from each other in the first semiconductor region, an element isolation insulating film which is formed on a main surface of the semiconductor substrate between the second semiconductor region and the third semiconductor region, and a first electrode which is formed on the element isolation insulating film. The semiconductor device further includes an interlayer insulating film which is formed on the semiconductor substrate so as to cover the element isolation insulating film and the first electrode, and a first plug, a second plug, and a third plug which are buried in the interlayer insulating film. An impurity concentration of the second semiconductor region is higher than an impurity concentration of the first semiconductor region, the first semiconductor region and the second semiconductor region are base semiconductor regions of the bipolar transistor, and the third semiconductor region is an emitter semiconductor region of the bipolar transistor. The first plug is disposed on the third semiconductor region and is electrically connected to the third semiconductor region, the second plug is disposed on the first electrode and is electrically connected to the first electrode, the third plug is disposed on the second semiconductor region and is electrically connected to the second semiconductor region, and the first plug and the second plug are electrically connected. When seen in a plan view, the first electrode is formed between the second semiconductor region and the third semiconductor region, and at least a part of the first electrode is buried in a first trench which is formed in the element isolation insulating film.

According to an embodiment, it is possible to improve reliability of a semiconductor device which has a bipolar transistor.

BRIEF DESCRIPTIONS OF THE DRAWINGS

DETAILED DESCRIPTION

In the embodiments described below, the invention will be described in a plurality of sections or embodiments when required as a matter of convenience, but these sections or embodiments are not irrelevant to each other unless otherwise stated, and the one relates to a part or the entire of the other as a modified example, details, a supplementary explanation, or the like thereof. Also, in the embodiments described below, when referring to the number of elements and the like (including number of pieces, values, amount, range, and the like), the number of the elements is not limited to a number referred unless otherwise stated or except the case and the like where the number is apparently limited to a specific number in principle, and the number larger or smaller than the number referred is also applicable. Further, in the embodiments described below, it goes without saying that the components (including element steps and the like) are not always indispensable unless otherwise stated or except the case and the like where the components are apparently indispensable in principle. Similarly, in the embodiments described below, when the shape of the components, positional relation thereof, and the like are referred, the substantially approximate and similar shapes and the like are included therein unless otherwise stated or except the case and the like where it is conceivable that they are apparently excluded in principle. The same goes for the numerical value and the range described above.

Hereinafter, embodiments will be described in detail with reference to the accompanying drawings. Note that members having the same function are denoted by the same reference symbols throughout the drawings for describing the embodiments, and the repetitive description thereof is omitted. In addition, the description of the same or similar portions is not repeated in principle unless particularly required in the following embodiments.

In addition, in some drawings used in the embodiments, hatching may be omitted even in a cross-sectional view so as to make the drawings easy to see. Also, hatching may be used even in a plan view so as to make the drawings easy to see.

(First Embodiment)

<Regarding Structure of Semiconductor Device>

Figure 1:
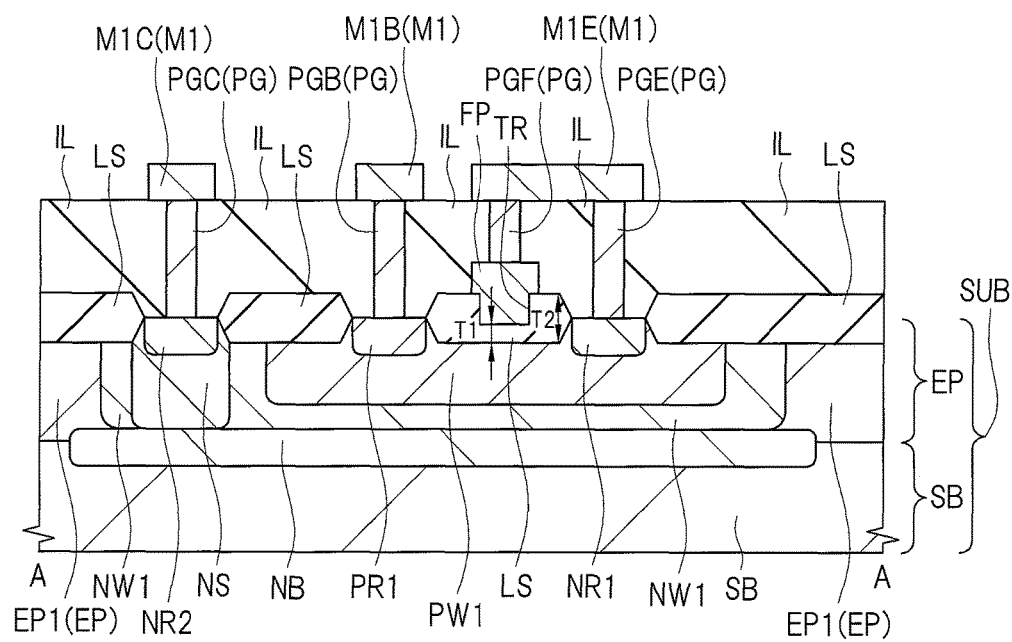
FIG. 1 is a cross-sectional view of a main part of a semiconductor device according to an embodiment.
Figure 2:
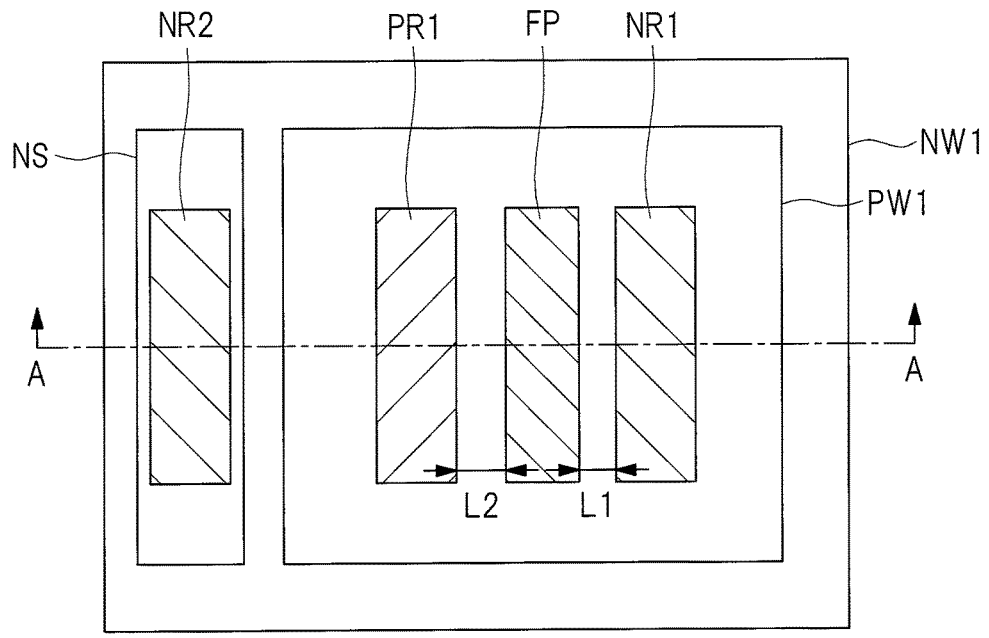
FIG. 2 is a cross-sectional view of a main part of the semiconductor device according to the embodiment.
Figure 3:
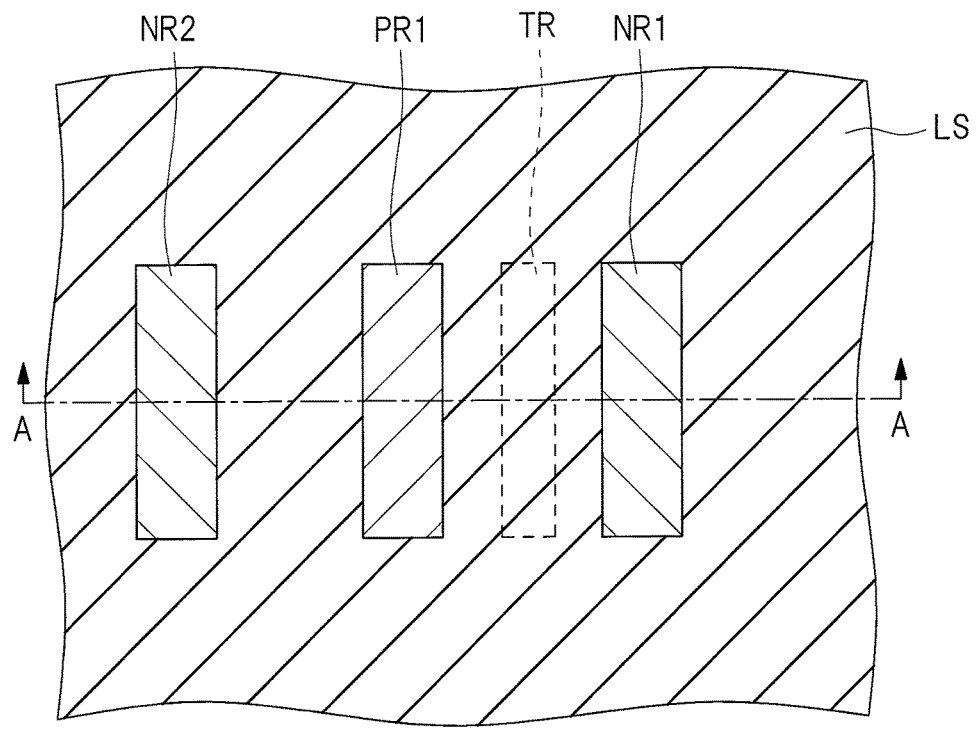
FIG. 3 is a cross-sectional view of a main part of the semiconductor device according to the embodiment.

A semiconductor device according to an embodiment will be described with reference to the drawings. FIG. 1 is a cross-sectional view of a main part of the semiconductor device according to the present embodiment, FIGS. 2 and 3 are plan views of the main part of the semiconductor device according to the present embodiment. FIGS. 2 and 3 illustrate the same planar region. For simple understanding, a $p^+$-type semiconductor region PR1, an $n^+$-type semiconductor region NR1, an $n^+$-type semiconductor region NR2, and an electrode FP are hatched by fine oblique lines in FIG. 2, and the $p^+$-type semiconductor region PR1, the $n^+$-type semiconductor region NR1 and the $n^+$-type semiconductor region NR2 are hatched by fine oblique lines, and the element isolation region LS is hatched by thick oblique lines in FIG. 3. In addition, FIG. 3 illustrates a position of a trench TR formed in the element isolation region LS using a dotted line. Each cross-sectional view taken along a line A-A of FIGS. 2 and 3 substantially corresponds to FIG. 1.

The semiconductor device according to the present embodiment is a semiconductor device which has a bipolar transistor.

Hereinafter, a description will be given in detail regarding a structure of the semiconductor device according to the present embodiment with reference to FIGS. 1 to 3.

As illustrated in FIGS. 1 to 3, the bipolar transistor is formed on a main surface of a semiconductor substrate SUB.

The semiconductor substrate SUB includes a substrate body SB which is a semiconductor substrate made of a p-type monocrystalline silicon in which a p-type impurity, for example, boron (B) or the like is introduced, and an epitaxial layer (a semiconductor layer or an epitaxial semiconductor layer) EP made of a $p^-$-type monocrystalline silicon which is formed on a main surface of the substrate body SB. Thus, the semiconductor substrate SUB is a so-called epitaxial wafer. Although the substrate body SB and the epitaxial layer EP are the same conductivity types (here, the p type), an impurity concentration of the substrate body SB (a p-type impurity concentration) is set to be higher than an impurity concentration of the epitaxial layer EP (a p-type impurity concentration), and resistivity (specific resistance) of the substrate body SB is lower than resistivity (specific resistance) of the epitaxial layer EP.

Here, a region which is maintained in a p$^-$-type state in the epitaxial layer EP will be referred to as a p$^-$-type epitaxial layer EP1. An upper part of an n$^+$-type buried region NB, an n-type well NW1, a p-type well PW1, the n$^+$-type semiconductor' region NR1, the p$^+$-type semiconductor region PR1, the n$^+$-type semiconductor region NR2, and an n$^+$-type sinker region NS are formed in the epitaxial layer EP, and the remaining region corresponds to the p$^-$-type epitaxial layer EP1. Thus, the p$^-$-type epitaxial layer EP1 is the same conductivity type (here, the p type) as the substrate body SB, but an impurity concentration (the p-type impurity concentration) of the p$^-$-type epitaxial layer EP1 is lower than the impurity concentration (the p-type impurity concentration) of the substrate body SB, and resistivity of the p$^-$-type epitaxial layer EP1 is higher than the resistivity of the substrate body SB.

An element isolation region (an element isolation insulating film or a field insulating film) LS, made of an insulating film, is formed on the main surface (the upper surface) of the semiconductor substrate SUB. The element isolation region LS can be regarded as an element isolation insulating film. Here, a case in which an LOCOS oxide film formed through a local oxidation of silicon (LOCOS) method is formed as the element isolation region LS is illustrated, but it is also possible to use an STI insulating film formed as the element isolation region LS through a shallow trench isolation (STI) method as another mode.

Here, the LOCOS oxide film (LOCOS isolation film) is an oxide film (silicon oxide film) which is formed through the LOCOS method. The LOCOS method is a technique in which an oxidation resistant film (for example, a silicon nitride film) is formed on the main surface of the semiconductor substrate, and then the semiconductor substrate is thermally oxidized to selectively (locally) form a thermal oxide film (LOCOS oxide film) on the main surface of the semiconductor substrate of a region which is not covered by the oxidation resistant film, and the thermal oxide film thus formed is the LOCOS oxide film (the LOCOS isolation film).

In addition, the STI insulating film (STI isolation film) is an insulating film which is formed through the STI method. The STI method is a technique in which a trench is formed on the main surface of the semiconductor substrate and then an insulating film is buried in the trench, and the insulating film buried in the trench is the STI insulating film (the STI isolation film).

The n$^+$-type buried region NB in which an n-type impurity is introduced (doped) at high concentration is formed between the substrate body SB and the epitaxial layer EP in the semiconductor substrate SUB. The n$^+$-type buried region NB is an n$^+$-type semiconductor region in which the n-type impurity is introduced at high concentration.

The n-type well NW1 is formed in the epitaxial layer EP, the p-type well PW1 is formed in the n-type well NW1, and the n$^+$-type semiconductor region NR1 and the p$^+$-type semiconductor region PR1 are formed in the p-type well PW1.

The n-type well NW1 is formed on the n$^+$-type buried region NB, and a bottom surface (lower surface) of the n-type well NW1 is in contact with the n$^+$-type buried region NB. Side surfaces of the n-type well NW1 are in contact with the p$^-$-type epitaxial layer EP1. In addition, the side surfaces of the n-type well NW1 are positioned below the element isolation region LS. The n-type well NW1 is an n-type semiconductor region.

The p-type well PW1 is formed to be enclosed in the n-type well NW1. Thus, a bottom surface (lower surface) and side surfaces of the p-type well PW1 are in contact with the n-type well NW1. In addition, side surfaces of the p-type well PW1 are positioned below the element isolation region LS. The p-type well PW1 is a p-type semiconductor region.

The n$^+$-type semiconductor region NR1 is formed to be enclosed in the p-type well PW1. Thus, a bottom surface (lower surface) and side surfaces of the n$^+$-type semiconductor region NR1 are in contact with the p-type well PW1. The n$^+$-type semiconductor region NR1 is not in contact with the n-type well NW1, and a part of the p-type well PW1 is interposed between the n$^+$-type semiconductor region NR1 and the n-type well NW1.

The p$^+$-type semiconductor region PR1 is formed to be enclosed in the p-type well PW1. Thus, a bottom surface (lower surface) and side surfaces of the p$^+$-type semiconductor region PR1 are in contact with the p-type well PW1. The p$^+$-type semiconductor region PR1 is not in contact with the n-type well NW1, and a part of the p-type well PW1 is interposed between the p$^+$-type semiconductor region PR1 and the n-type well NW1. In addition, although the n$^+$-type semiconductor region NR1 and the p$^+$-type semiconductor region PR1 are formed in the p-type well PW1, the p$^+$-type semiconductor region PR1 and the n$^+$-type semiconductor region NR1 are not in contact with each other and formed to be spaced apart from each other.

The n$^+$-type semiconductor region NR1 and the p$^+$-type semiconductor region PR1 are formed in a surface layer portion of the epitaxial layer EP and accordingly are formed in a surface layer portion of the semiconductor substrate SUB. Thus, an upper surface of the n$^+$-type semiconductor region NR1 and an upper surface of the p$^+$-type semiconductor region PR1 match the upper surface of the epitaxial layer EP (the upper surface of the semiconductor substrate SUB). The element isolation region LS is not formed on the n$^+$-type semiconductor region NR1 and on the p$^+$-type semiconductor region PR1, the n$^+$-type semiconductor region NR1 is surrounded by the element isolation region LS when seen in a plan view, and in addition, the p$^+$-type semiconductor region PR1 is also surrounded by the element isolation region LS. That is, the n$^+$-type semiconductor region NR1, the p$^+$-type semiconductor region PR1, and the n$^+$-type semiconductor region NR2 to be described later each are formed as an active region (a region in which the element isolation region LS is not formed) which is surrounded by the element isolation region LS in the main surface of the semiconductor substrate SUB.

Here, the expression, "seen in a plan view" corresponds to the case of being seen in a plane parallel to the main surface of the semiconductor substrate SUB.

Further, the n$^+$-type semiconductor region NR2 and the n$^+$-type sinker region NS are also formed in the n-type well NW1. The n$^+$-type semiconductor region NR2 is formed in the surface layer portion of the epitaxial layer EP and accordingly is formed in the surface layer portion of the semiconductor substrate SUB. Thus, an upper surface of the n$^+$-type semiconductor region NR2 matches the upper surface of the epitaxial layer EP (the upper surface of the semiconductor substrate SUB). The element isolation region LS is not formed on the n$^+$-type semiconductor region NR2, and when seen in a plan view, the n+-type semiconductor region NR2 is surrounded by the element isolation region LS.

In addition, when seen in a plan view, the p+-type semiconductor region PR1 is disposed between the n+-type semiconductor region NR1 and the n+-type semiconductor region NR2. Thus, when seen in a plan view, the element isolation region LS is interposed between the n+-type semiconductor region NR1 and the p+-type semiconductor region PR1, and the element isolation region LS is interposed also between the p+-type semiconductor region PR1 and the n+-type semiconductor region NR2.

The n+-type sinker region NS is formed so as to reach the n+-type buried region NB. Thus, a bottom surface (lower surface) of the n+-type sinker region NS is in contact with the n+-type buried region NB. Side surfaces of the n+-type sinker region NS are in contact with the n-type well NW1. The n+-type semiconductor region NR2 is formed to be enclosed in the n+-type sinker region NS. Thus, a bottom surface (lower surface) and side surfaces of the n+-type semiconductor region NR2 are in contact with the n+-type sinker region NS. The n+-type sinker region NS is interposed between the n+-type semiconductor region NR2 and the n+-type buried region NB. In addition, the n+-type sinker region NS and the p-type well PW1 are not in contact with each other, and a part of the n-type well NW1 is interposed between the n+-type sinker region NS and the p-type well PW1. The n+-type sinker region NS is an n+-type semiconductor region in which an n-type impurity is introduced at high concentration.

The n+-type semiconductor region NR2, the n+-type sinker region NS, and the n+-type buried region NB are formed in the state of being continuously linked. Any one among the n+-type semiconductor region NR2, the n+-type sinker region NS, and the n+-type buried region NB has a higher impurity concentration than the n-type well NW1. Thus, the n+-type semiconductor region NR2 is in the state of being electrically connected to the n+-type buried region NB via the n+-type sinker region NS with low resistance.

The n+-type semiconductor region NR1, the p+-type semiconductor region PR1, and the n+-type semiconductor region NR2 are spaced apart from each other, and when seen in a plan view, the p+-type semiconductor region PR1 is formed between the n+-type semiconductor region NR1 and the n+-type semiconductor region NR2. Thus, the n+-type semiconductor region NR1, the p+-type semiconductor region PR1, and the n+-type semiconductor region NR2 are not in contact with each other. The element isolation region LS is present between the n+-type semiconductor region NR1 and the p+-type semiconductor region PR1, and the element isolation region LS is present also between the n+-type semiconductor region NR2 and the p+-type semiconductor region PR1.

In addition, the p-type well PW1 is present immediately below the element isolation region LS interposed between the n+-type semiconductor region NR1 and the p+-type semiconductor region PR1. That is, the p-type well PW1 extends below the element isolation region LS which is positioned between the n+-type semiconductor region NR1 and the p+-type semiconductor region PR1. Thus, a lower surface of the element isolation region LS which is positioned between the n+-type semiconductor region NR1 and the p+-type semiconductor region PR1 is in contact with the p-type well PW1. Accordingly, a part of the p-type well PW1 is interposed between the n+-type semiconductor region NR1 and the p+-type semiconductor region PR1.

In addition, a part of the n-type well NW1 and a part of the p-type well PW1 are present immediately below the element isolation region LS which is interposed between the n+-type semiconductor region NR2 and the p+-type semiconductor region PR1, and a region immediately below the element isolation region LS is formed to include the n-type well NW1 on the n+-type semiconductor region NR2 side and the p-type well PW1 on the p+-type semiconductor region PR1 side. Thus, the part of the n-type well NW1 and the part of the p-type well PW1 are interposed between the n+-type semiconductor region NR2 and the p+-type semiconductor region PR1, so that the n-type well NW1 is formed on the n+-type semiconductor region NR2 side, and the p-type well PW1 is formed on the p+-type semiconductor region PR1 side.

In a case in which the n+-type semiconductor region NR2 is not in contact with the n-type well NW1 and a part of the n+-type sinker region NS is interposed between the n+-type semiconductor region NR2 and the n-type well NW1, the part of the n+-type sinker region NS which is interposed between the n+-type semiconductor region NR2 and the n-type well NW1, the part of the n-type well NW1, and the part of the p-type well PW1 are interposed between the n+-type semiconductor region NR2 and the p+-type semiconductor region PR1.

The n+-type buried region NB is formed in the vicinity of an interface between the substrate body SB and the epitaxial layer EP across, the substrate body SB and the epitaxial layer EP. Thus, a lower part of the n+-type buried region NB is formed in the substrate body SB, and an upper part of the n+-type buried region NB is formed in the epitaxial layer EP.

A bottom surface (lower surface) of the n+-type buried region NB is in contact with the substrate body SB of the p-type. An upper surface of the n+-type buried region NB is mainly in contact with the bottom surface of the n-type well NW1 but is also in contact with a bottom surface of the n+-type sinker region NS which is formed in the n-type well NW1. The upper surface of the n+-type buried region NB is in contact with the p−-type epitaxial layer EP1 in a region in which the n-type well NW1 is not formed. Lower parts of side surfaces of the n+-type buried region NB are in contact with the substrate body SB of the p type, and upper parts of side surfaces thereof are in contact with the p−-type epitaxial layer EP1.

The trench TR is formed in the element isolation region LS interposed between the n+-type semiconductor region NR1 and the p+-type semiconductor region PR1, and the electrode FP is formed on the element isolation region LS including in the trench TR. An inside of the trench TR is buried with the electrode FP. When seen in a plan view, the trench TR is enclosed by the electrode FP. The electrode FP includes integrally a part to be buried in the trench TR and a part positioned (extending) on the element isolation region LS outside the trench TR. If a plug PGF can be connected to the electrode FP, a case in which the electrode FP does not include the part positioned (extending) on the element isolation region LS outside the trench TR may be also possible. The electrode FP can be also regarded as a field plate electrode.

When seen in a plan view, the trench TR is disposed between the n+-type semiconductor region NR1 and the p+-type semiconductor region PR1. Thus, when seen in a plan view, the electrode FP is disposed between the n+-type semiconductor region NR1 and the p+-type semiconductor region PR1. The element isolation region LS is present immediately below the electrode FP. A thickness of the element isolation region LS immediately below the trench TR is smaller (thinner) than a thickness of the element isolation region LS outside the trench TR. Thus, a thickness of the element isolation region LS of the part buried in the trench TR immediately below the electrode FP is smaller (thinner) than a thickness of the element isolation region LS of the part positioned outside the trench TR immediately below the electrode FP. The element isolation region LS is present immediately below the electrode FP, and further the p-type well PW1 is present immediately below the element isolation region LS, so that the electrode FP opposes the p-type well PW1 with the element isolation region LS (the element isolation region LS of the part positioned immediately below the electrode FP) interposed therebetween when seen in the vertical direction.

The electrode FP is made of a conductive film and for example, is made of a polysilicon film (doped polysilicon film) in which an impurity (phosphorus, boron, arsenic, or the like) is introduced. As another mode, it is also possible to use a metal material such as aluminum (Al), copper (Cu), or tungsten (W) as a material forming the electrode FP.

An interlayer insulating film IL is formed as an insulating film on the main surface (the upper surface) of the semiconductor substrate SUB so as to cover the element isolation region LS and the electrode FP. The interlayer insulating film IL is, for example, made of a silicon oxide film or the like. An upper surface of the interlayer insulating film IL is flattened. It is also possible to use a laminated insulating film as the interlayer insulating film IL, for example, it is also possible to use a laminated film including a silicon nitride film and a silicon oxide film on the silicon nitride film as the interlayer insulating film IL, and in this case, it is preferable that the silicon oxide film be thicker than the silicon nitride film. Note that the laminated insulating film is a laminated film including a plurality of insulating films.

A contact hole (an opening portion, a through hole, or a penetration hole) is formed in the interlayer insulating film IL, and a conductive plug (a buried conductor for connection or a contact plug) PG which has a tungsten (W) film, for example, as a main body is formed in the contact hole. That is, the conductive plug PG is buried in the contact hole which is formed in the interlayer insulating film IL. The plug PG is a connection plug, that is, the contact plug. A plurality of plugs PG are formed and include an emitter plug PGE, a base plug PGB, a collector plug PGC, and a plug PGF.

Here, the plug PG which is disposed on the $n^+$-type emitter semiconductor region NR1 and is electrically connected to the $n^+$-type emitter semiconductor region NR1 will be referred to as the emitter plug PGE among the plugs PG. In addition, the plug PG which is disposed on the $p^+$-type base semiconductor region PR1 and is electrically connected to the $p^+$-type base semiconductor region PR1 will be referred to as the base plug PGB among the plugs PG. In addition, the plug PG which is disposed on the $n^+$-type collector semiconductor region NR2 and is electrically connected to the $n^+$-type collector semiconductor region NR2 will be referred to as the collector plug PGC among the plugs PG. In addition, the plug PG which is disposed on the electrode FP and is electrically connected to the electrode FP will be referred to as the plug PGF among the plugs PG.

The emitter plug PGE has a bottom surface being in contact with the $n^+$-type semiconductor region NR1 and thus is electrically connected to the $n^+$-type semiconductor region NR1. In a case in which a metal silicide layer is formed on the $n^+$-type semiconductor region NR1, the emitter plug PGE is in contact with the metal silicide layer on the $n^+$-type semiconductor region NR1 and is electrically connected to the $n^+$-type semiconductor region NR1 via the metal silicide layer.

The base plug PGB has a bottom surface being in contact with the $p^+$-type semiconductor region PR1 and thus is electrically connected to the $p^+$-type semiconductor region PR1. In a case in which the metal silicide layer is formed on the $p^+$-type semiconductor region PR1, the base plug PGB is in contact with the metal silicide layer on the $p^+$-type semiconductor region PR1 and is electrically connected to the $p^+$-type semiconductor region PR1 via the metal silicide layer.

The collector plug PGC has a bottom surface being in contact with the $n^+$-type semiconductor region NR2 and thus is electrically connected to the $n^+$-type semiconductor region NR2. In a case in which the metal silicide layer is formed on the $n^+$-type semiconductor region NR2, the collector plug PGC is in contact with the metal silicide layer on the $n^+$-type semiconductor region NR2 and is electrically connected to the $n^+$-type semiconductor region NR2 via the metal silicide layer.

The plug PGF has a bottom surface being in contact with the electrode FP and thus is electrically connected to the electrode FP. In a case in which the metal silicide layer is formed on the electrode FP, the plug PGF is in contact with the metal silicide layer on the electrode FP and is electrically connected to the electrode FP via the metal silicide layer.

A wire (first wire) M1 is formed on the interlayer insulating film IL in which one of the plugs PG is buried.

The wire M1 is formed by, for example, forming a conductive film on the interlayer insulating film IL in which one of the plugs PG is buried and then patterning the conductive film, and in this case, the wire M1 is made of the patterned conductive film. It is possible to suitably use an aluminum wire or the like, for example, as the wire M1. As another mode, it is also possible to use a damascene wire (buried wire) which is formed by a damascene method, as the wire M1. Additional interlayer insulating film and wire are formed on an upper layer than the interlayer insulating film IL and the wire M1, but the illustration and description thereof will be omitted here.

Here, the wire M1 which is electrically connected to the $n^+$-type emitter semiconductor region NR1 via the plug PG (more specifically, the emitter plug PGE) will be referred to as an emitter wire M1E among the wires M1. Note that the emitter wire M1E is electrically connected to the $n^+$-type emitter semiconductor region NR1 via the emitter plug PGE and is also electrically connected to the electrode FP via the plug PGF. In addition, the wire M1 which is electrically connected to the $p^+$-type base semiconductor region PR1 via the plug PG (more specifically, the base plug PGB) will be referred to as a base wire M1B among the wires M1. In addition, the wire M1 which is electrically connected to the $n^+$-type collector semiconductor region NR2 via the plug PG (more specifically, the collector plug PGC) will be referred to as a collector wire M1C among the wires M1. The emitter wire M1E, the base wire M1B, and the collector wire M1C are separated from each other. That is, the emitter wire M1E and the base wire M1B are not connected to each other through a conductor, the emitter wire M1E and the collector wire M1C are not connected to each other through a conductor, and the base wire M1B and the collector wire M1C are not connected to each other through a conductor.

The base wire M1B extends on the interlayer insulating film IL including on the base plug PGB and is overlapped with the base plug PGB when seen in a plan view, and as an upper surface of the base plug PGB is in contact with the base wire M1B, the base plug PGB and the base wire M1B are electrically connected to each other.

The collector wire M1C extends on the interlayer insulating film IL including on the collector plug PGC and is overlapped with the collector plug PGC when seen in a plan view, and as an upper surface of the collector plug PGC is in contact with the collector wire M1C, the collector plug PGC and the collector wire M1C are electrically connected to each other.

It is possible to supply a desired base voltage to the p$^+$-type base semiconductor region PR1 from the base wire M1B via the base plug PGB. In addition, it is possible to supply a desired collector voltage to the n$^+$-type collector semiconductor region NR2 from the collector wire M1C via the collector plug PGC.

The emitter wire M1E extends on the interlayer insulating film IL including on the emitter plug PGE and on the plug PGF and is overlapped with the emitter plug PGE and the plug PGF when seen in a plan view. As an upper surface of the emitter plug PGE is in contact with the emitter wire M1E, the emitter plug PGE and the emitter wire M1E are electrically connected to each other, and as an upper surface of the plug PGF is in contact with the emitter wire M1E, the plug PGF and the emitter wire M1E are electrically connected to each other. It is possible to supply a desired emitter voltage to the n$^+$-type emitter semiconductor region NR1 from the emitter wire M1E via the emitter plug PGE.

The emitter plug PGE is connected to the emitter wire M1E, and the plug PGF is also connected to the emitter wire M1E. That is, the electrode FP and the n$^+$-type emitter semiconductor region NR1 are electrically connected to the common emitter wire M1E via the respective plugs PG. In other words, the electrode FP and the n$^+$-type emitter semiconductor region NR1 are electrically connected to each other via the plug PGF, the emitter wire M1E, and the emitter plug PGE. Thus, it is possible to supply a desired emitter voltage to the n$^+$-type emitter semiconductor region NR1 from the emitter wire M1E via the emitter plug PGE, and it is configured such that the same voltage as the emitter voltage is supplied to the electrode FP from the corresponding emitter wire M1E via the plug PGF. Accordingly, the same voltage (emitter voltage) is supplied to the electrode FP and the n$^+$-type emitter semiconductor region NR1, and both have substantially the same potential. In other words, the electrode FP is fixed to the same potential as the n$^+$-type emitter semiconductor region NR1.

The bipolar transistor is formed in the semiconductor substrate SUB, the n$^+$-type semiconductor region NR1 functions as an emitter region of the bipolar transistor, and the p-type well PW1 and the p$^+$-type semiconductor region PR1 function as a base region of the bipolar transistor. In addition, the n-type well NW1, the n$^+$-type buried region NB, the n$^+$-type sinker region NS, and the n$^+$-type semiconductor region NR2 function as a collector region of the bipolar transistor. A PN junction surface formed between the emitter region and the base region corresponds to a PN junction surface formed between the n$^+$-type semiconductor region NR1 and the p-type well PW1, and a PN junction surface formed between the base region and the collector region corresponds to a PN junction surface formed between the p-type well PW1 and the n-type well NW1.

Thus, in the semiconductor substrate SUB, the base region (the p-type well PW1 and the p$^+$-type semiconductor region PR1) is formed to be enclosed in the collector region (the n-type well NW1, the n$^+$-type buried region NB, the n$^+$-type sinker region NS, and the n$^+$-type semiconductor region NR2), and the emitter region (the n$^+$-type semiconductor region NR1) is formed to be enclosed in the base region. In other words, in the semiconductor substrate SUB, the base region (the p-type well PW1 and the p$^+$-type semiconductor region PR1) is formed to surround the emitter region (the n$^+$-type semiconductor region NR1), and the collector region (the n-type well NW1, the n$^+$-type buried region NB, the n$^+$-type sinker region NS, and the n$^+$-type semiconductor region NR2) is formed to surround the base region.

In addition, the emitter plug PGE, or a combination of the emitter plug PGE and the emitter wire M1E functions as an emitter electrode. In addition, the base plug PGB or a combination of the base plug PGB and the base wire M1B functions as a base electrode. In addition, the collector plug PGC, or a combination of the collector plug PGC and the collector wire M1C functions as a collector electrode. The emitter voltage is supplied from the emitter plug PGE to the n$^+$-type semiconductor region NR1, the base voltage is supplied from the base plug PGB to the p$^+$-type semiconductor region PR1, and the collector voltage is supplied from the collector plug PGC to the n$^+$-type semiconductor region NR2.

A p-type impurity concentration of the p$^+$-type semiconductor region PR1 is higher than a p-type impurity concentration of the p-type well PW1, and the p$^+$-type semiconductor region PR1 can function as the contact region that connects the base region to the base electrode. It is possible to reduce contact resistance by connecting the base electrode (the base plug PGB) to the p$^+$-type semiconductor region PR1 with the high impurity concentration. Meanwhile, the p-type well PW1 has a lower impurity concentration than the p$^+$-type semiconductor region PR1, and the impurity concentration of the p-type well PW1 can be set independently from the p$^+$-type semiconductor region PR1. Thus, it is possible to set the impurity concentration of the p-type well PW1 to a suitable impurity concentration as the base region to form the PN junction with the emitter region (the n$^+$-type semiconductor region NR1) while reducing the contact resistance of the base electrode (the base plug PGB) by forming the p$^+$-type semiconductor region PR1 to have the high impurity concentration.

In addition, each n-type impurity concentration of the n$^+$-type buried region NB, the n$^+$-type sinker region NS, and the n$^+$-type semiconductor region NR2 is higher than an n-type impurity concentration of the n-type well NW1. An impurity concentration of the n-type well NW1 can be set independently from the n$^+$-type buried region NB, the n$^+$-type sinker region NS, and the n$^+$-type semiconductor region NR2, and thus, it is possible to set the impurity concentration of the n-type well NW1 to a suitable impurity concentration as the collector region to form the PN junction with the base region (the p-type well PW1). In addition, it is possible to reduce the collector resistance by providing the n$^+$-type buried region NB and the n$^+$-type sinker region NS with the higher impurity concentration than the n-type well NW1. The n$^+$-type sinker region NS can function as a lifting region in which the n$^+$-type buried region NB is lifted up to the front surface side of the semiconductor substrate SUB. In addition, the n-type impurity concentration of the n$^+$-type semiconductor region NR2 is higher than the n-type impurity concentration of the n$^+$-type sinker region NS. The n$^+$-type semiconductor region NR2 can function as the contact region that connects the collector region to the collector electrode. It is possible to reduce the contact resistance by connecting the collector electrode (the collector plug PGC) to the n$^+$-type semiconductor region NR2 with the high impurity concentration.

<Regarding Manufacturing Process of Semiconductor Device>

Next, the manufacturing process of the semiconductor device of the present embodiment will be described with reference to the drawings. FIGS. 4 to 31 are cross-sectional views of main parts during the manufacturing process of the semiconductor device according to the present embodiment.

Among FIGS. 4 to 31, FIGS. 4, 6, 8, 10, 12, 14, 16, 18, 20, 22, 24, 26, 28 and 30 illustrate the cross-sectional views of the main part of a bipolar transistor forming region 1A and illustrate a cross-sectional region corresponding to FIG. 2 described above. In addition, among FIGS. 4 to 31, FIGS. 5, 7, 9, 11, 13, 15, 17, 19, 21, 23, 25, 27, 29 and 31 illustrate the cross-sectional views of the main part of an nMOSFET forming region 1B and a pMOSFET forming region 1C. FIGS. 4 to 31 illustrate a state in which the bipolar transistor, an n-channel type MOSFET, and a p-channel type MOSFET are respectively formed in the bipolar transistor forming region 1A, the nMOSFET forming region 1B, and the pMOSFET forming region 1C.

Here, the bipolar transistor forming region 1A is a region in which the bipolar transistor is planned to be formed in (the main surface of) the semiconductor substrate SUB. In addition, the nMOSFET forming region 1B is a region in which the n-channel type MOSFET is planned to be formed in (the main surface of) the semiconductor substrate SUB. In addition, the pMOSFET forming region 1C is a region in which the p-channel type MOSFET is planned to be formed in (the main surface of) the semiconductor substrate SUB.

Note that, in the present application, the metal oxide semiconductor field effect transistor (MOSFET) includes not only the metal insulator semiconductor field effect transistor (MISFET) in which an oxide film (silicon oxide film) is used as a gate insulating film, but also the MISFET in which an insulating film other than the oxide film (silicon oxide film) is used as the gate insulating film.

The bipolar transistor forming region 1A, the nMOSFET forming region 1B, and the pMOSFET forming region 1C are present on the same semiconductor substrate SUB. That is, the bipolar transistor forming region 1A, the nMOSFET forming region 1B, and the pMOSFET forming region 1C correspond to mutually different planar regions of the main surface of the same semiconductor substrate SUB.

Figure 4:
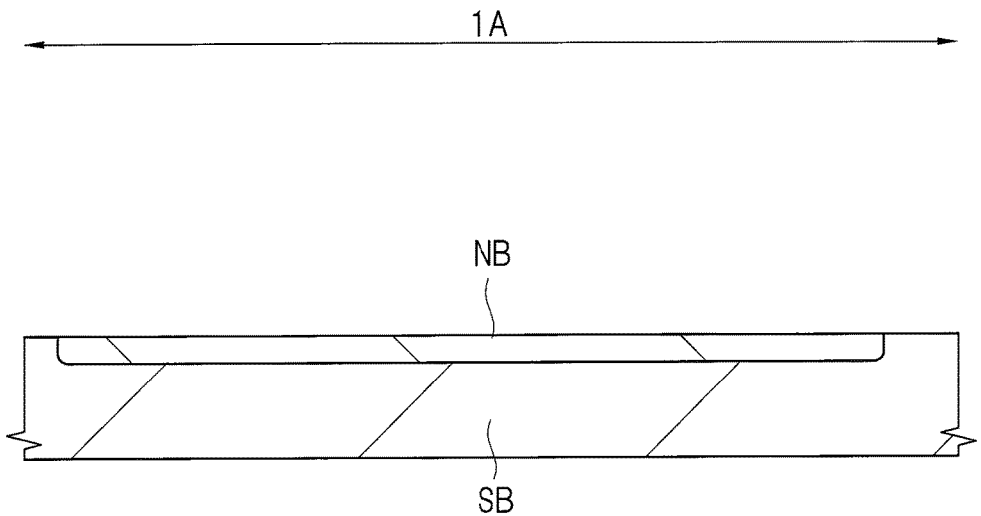
FIG. 4 is a cross-sectional view of a main part during a manufacturing process of the semiconductor device according to the embodiment.
Figure 5:
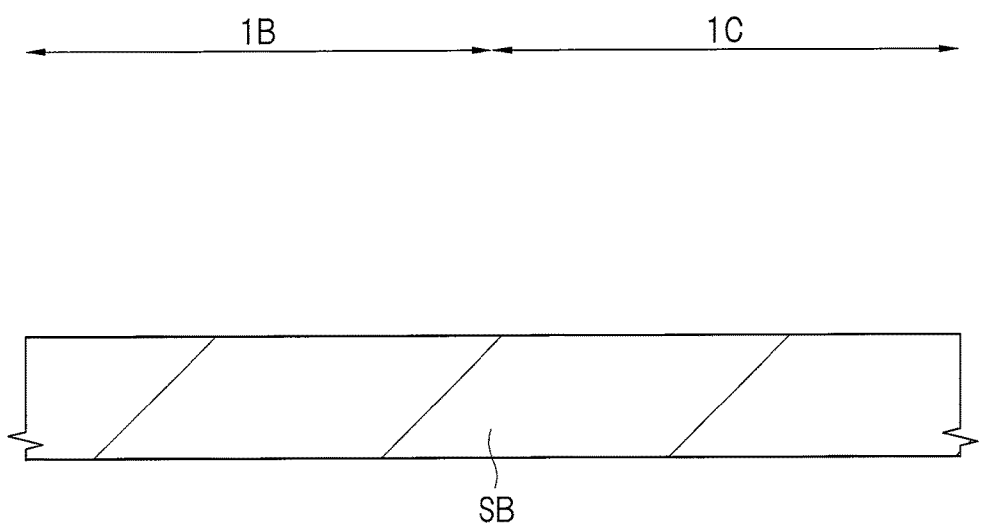
FIG. 5 is a cross-sectional view of the main part during the manufacturing process of the semiconductor device similar to FIG. 4.

First, the substrate body SB is prepared (produced) as illustrated in FIGS. 4 and 5. The substrate body SB is a semiconductor substrate made of the p monocrystalline silicon or the like in which the p-type impurity such as boron (B), for example, is introduced.

Next, the n$^+$-type buried region NB is formed in the substrate body SB of the bipolar transistor forming region 1A. The n$^+$-type buried region NB can be formed as follows, for example.

That is, it is possible to form the n$^+$-type buried region NB by introducing an n-type impurity such as antimony (Sb) or arsenic (As) in an n$^+$-type buried region NB formation-planned region of the front surface of the substrate body SB and thermally diffusing the introduced n-type impurity. The n$^+$-type buried region NB is formed from the front surface of the substrate body SB to a predetermined depth.

Figure 6:
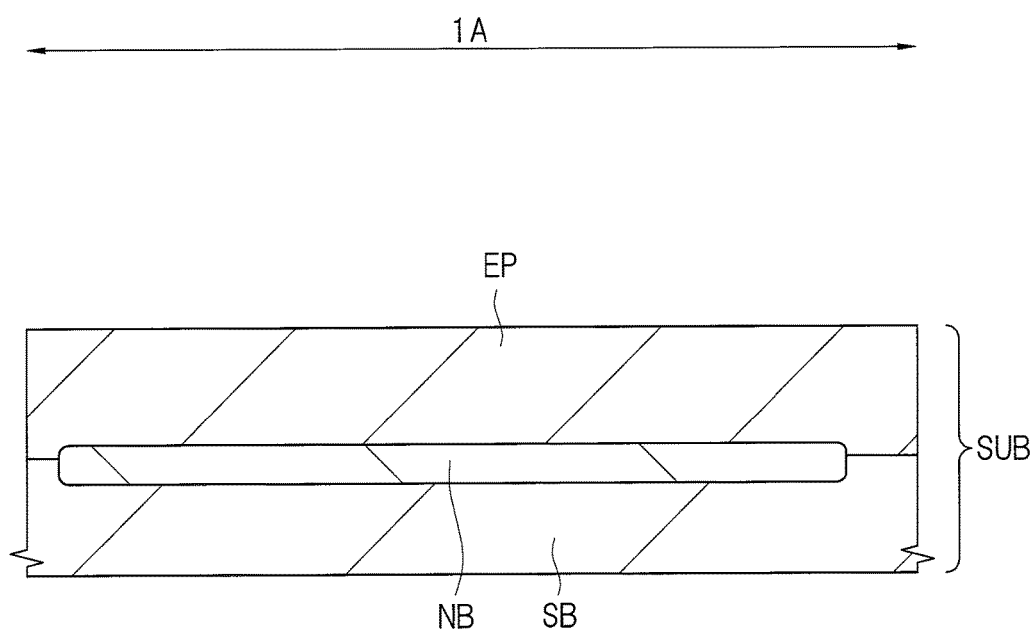
FIG. 6 is a cross-sectional view of the main part during the manufacturing process of the semiconductor device subsequently to FIG. 4.
Figure 7:
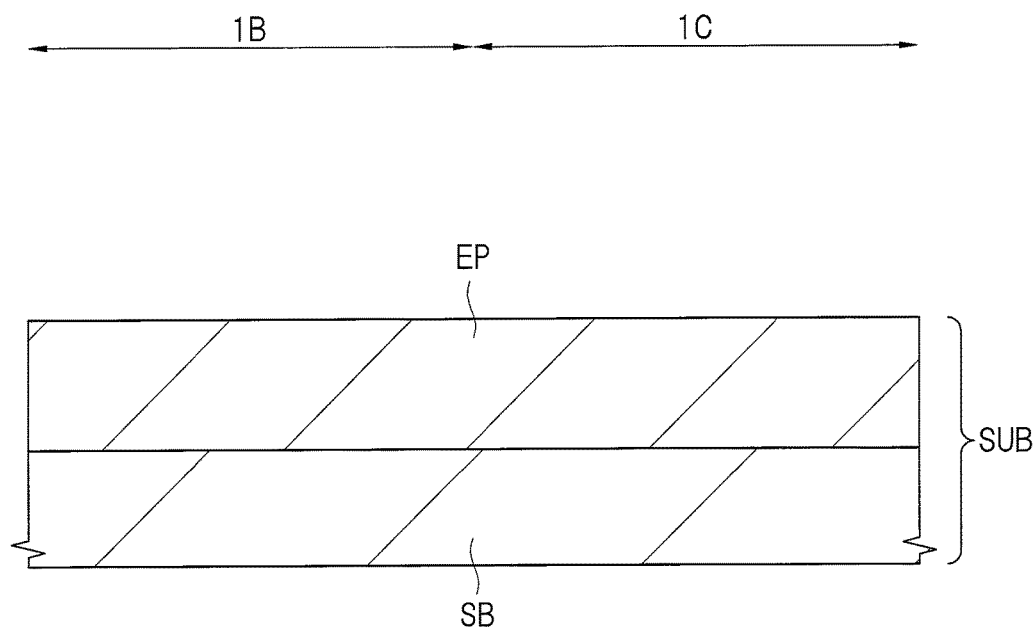
FIG. 7 is a cross-sectional view of the main part during the manufacturing process of the semiconductor device similar to FIG. 6.

Next, the epitaxial layer EP is formed on the main surface of the substrate body SB as illustrated in FIGS. 6 and 7. In this manner, the semiconductor substrate SUB in which the epitaxial layer EP is formed on the main surface of the substrate body SB is formed.

The epitaxial layer EP is made of the p$^-$ monocrystalline silicon or the like in which a p-type impurity is introduced and can be formed using an epitaxial growth method. An impurity concentration (p-type impurity concentration) of the epitaxial layer EP is lower than an impurity concentration (p-type impurity concentration) of the substrate body SB.

The epitaxial layer EP is formed on the entire main surface of the substrate body SB including the n$^+$-type buried region NB. When the epitaxial layer EP is epitaxially grown, the n-type impurity included in the n$^+$-type buried region NB is diffused to the epitaxial layer EP side. Thus, when the epitaxial layer EP is formed on the main surface of the substrate body SB, a lower region of the n$^+$-type buried region NB is formed in the substrate body SB, and an upper region of the n$^+$-type buried region NB is in the state of being formed in the epitaxial layer EP. However, the n$^+$-type buried region NB does not reach a front surface of the epitaxial layer EP, the upper surface of the n$^+$-type buried region NB is at a deep position by a predetermined depth from the front surface of the epitaxial layer EP, and the p$^-$-type epitaxial layer EP is present on the n$^+$-type buried region NB.

Figure 8:
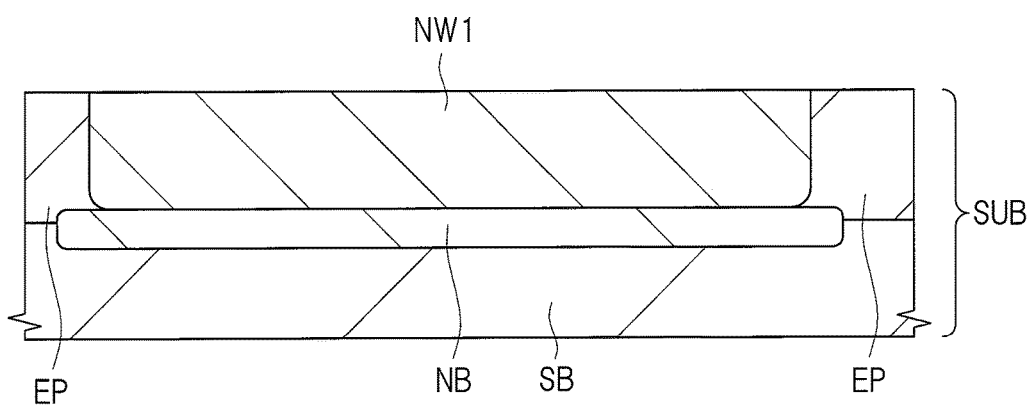
FIG. 8 is a cross-sectional view of the main part during the manufacturing process of the semiconductor device subsequently to FIG. 6.
Figure 9:
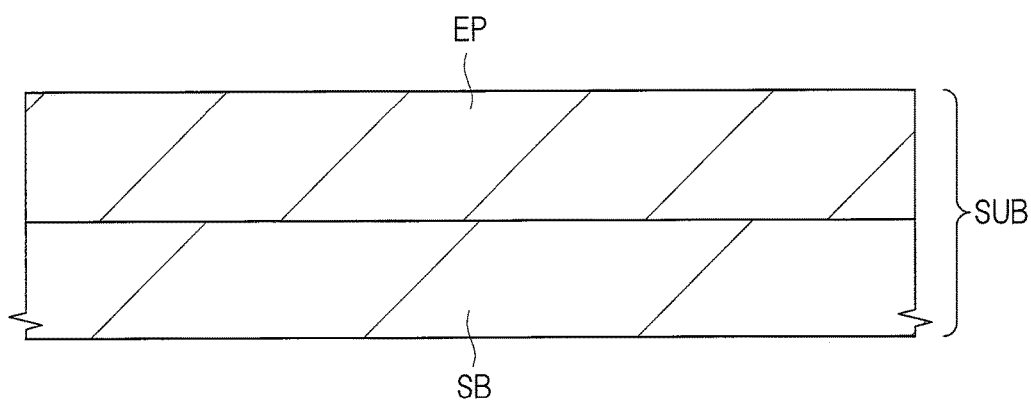
FIG. 9 is a cross-sectional view of the main part during the manufacturing process of the semiconductor device similar to FIG. 8.

Next, the n-type well NW1 is formed in the epitaxial layer EP of the semiconductor substrate SUB in the bipolar transistor forming region 1A as illustrated in FIGS. 8 and 9. The n-type well NW1 can be formed as follows, for example.

That is, it is possible to form the n-type well NW1 by introducing an n-type impurity such as phosphorus (P) in an n-type well NW1 formation-planned region of the epitaxial layer EP using an ion implantation method or the like and thermally diffusing the introduced n-type impurity. At this time, the thermal diffusion is performed until the bottom surface (the lower surface) of the n-type well NW1 reaches the n$^+$-type buried region NB, and thus, the n-type well NW1 is in the state of being formed on the n$^+$-type buried region NB to be in contact with the n$^+$-type buried region NB. Thus, the bottom surface (the lower surface) of the n-type well NW1 is in contact with the upper surface of the n$^+$-type buried region NB. The n-type well NW1 is formed across the upper surface of the n$^+$-type buried region NB from the front surface of the epitaxial layer EP.

Figure 10:
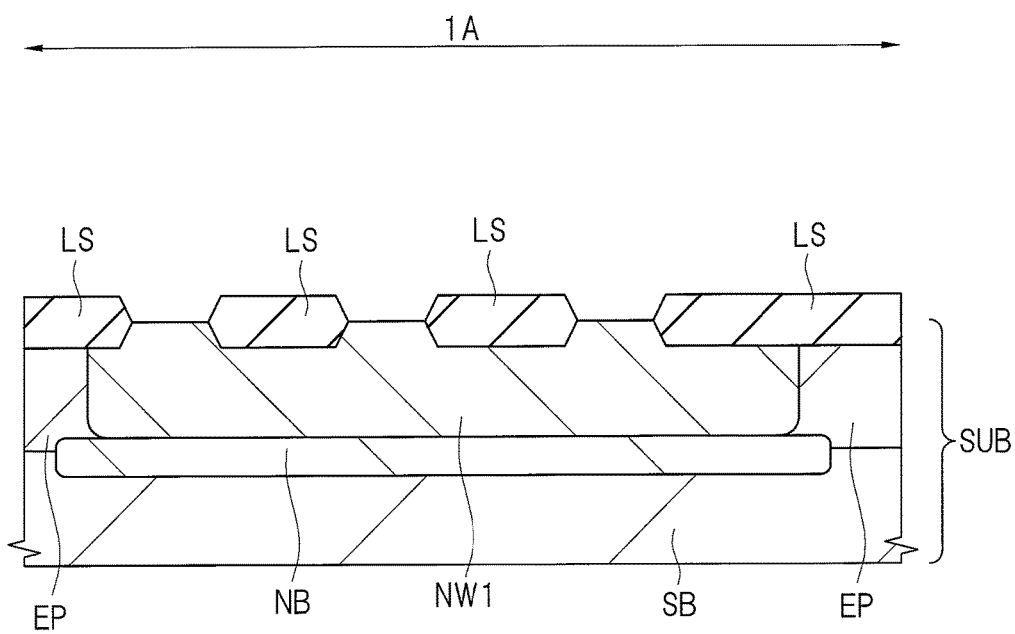
FIG. 10 is a cross-sectional view of the main part during the manufacturing process of the semiconductor device subsequently to FIG. 8.
Figure 11:
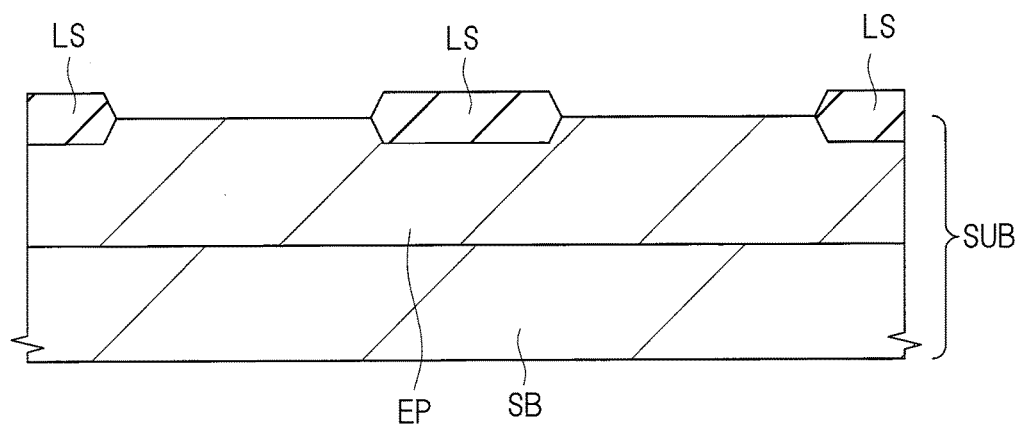
FIG. 11 is a cross-sectional view of the main part during the manufacturing process of the semiconductor device similar to FIG. 10.

Next, the element isolation region LS made of the insulating film is formed on the main surface of the semiconductor substrate SUB, that is, the main surface of the epitaxial layer EP as illustrated in FIGS. 10 and 11.

Here, although a case in which the LOCOS oxide film formed through the LOCOS method is formed as the element isolation region LS is illustrated, it is also possible to use the STI insulating film formed as the element isolation region LS through the STI method as another mode.

In a case in which the LOCOS oxide film is formed as the element isolation region LS using the LOCOS method, it is possible to form the LOCOS oxide film (the element isolation region LS) specifically as follows.

That is, first, a silicon nitride film to be used as a heat-resistant oxide film is formed on the main surface of the semiconductor substrate SUB (that is, the main surface of the epitaxial layer EP), and then, the silicon nitride film of a region in which the LOCOS oxide film is planned to be formed is removed using a photolithography technique and an etching technique. Accordingly, a state in which the silicon nitride film is not formed in the region in which the LOCOS oxide film is planned to be formed, and in which the silicon nitride film is formed in a region in which the LOCOS oxide film is planned not to be formed is obtained. Thereafter, thermal oxidation is performed to oxidize the front surface of the semiconductor substrate SUB (that is, the front surface of the epitaxial layer EP) in a region which is not covered by the silicon nitride film (that is, the region in which the LOCOS oxide film is planned to be formed), thereby forming the LOCOS oxide film (the element isolation region LS) which is made of silicon oxide. At the time of the thermal oxidation, the silicon nitride film functions as a heat-resistant oxide film. Thus, the thermal oxide film is not formed in a region which is covered by the silicon nitride film in the front surface of the semiconductor substrate SUB (that is, the front surface of the epitaxial layer EP), and accordingly, the LOCOS oxide film (the element isolation region LS) is not formed. Thus, the LOCOS oxide film (the element isolation region LS) is selectively (locally) formed in the region which is not covered by the silicon nitride film in the front surface of the semiconductor substrate SUB (that is, the front surface of the epitaxial layer EP). Thereafter, the silicon nitride film that has been used as the heat-resistant oxide film is removed by etching or the like, and this state is illustrated in FIGS. 10 and 11.

In a case in which the STI insulating film is formed as the element isolation region LS using the STI method, it is possible to form the STI insulating film (the element isolation region LS) specifically as follows.

That is, an element isolation trench (trench for element isolation) is formed in the main surface of the semiconductor substrate SUB (that is, the main surface of the epitaxial layer EP) by etching or the like, and then, an insulating film made of silicon oxide (for example, ozone-tetraethoxysilane (TEOS) oxide film) and the like is formed on the semiconductor substrate SUB so as to be buried in the element isolation trench. Thereafter, the insulating film is polished using a chemical mechanical polishing (CMP) method or the like to remove an unnecessary insulating film outside the element isolation trench and leave an insulating film in the element isolation trench. Accordingly, it is possible to form the STI insulating film (the element isolation region LS) made of the insulating film (insulator) that is buried in the element isolation trench.

Figure 12:
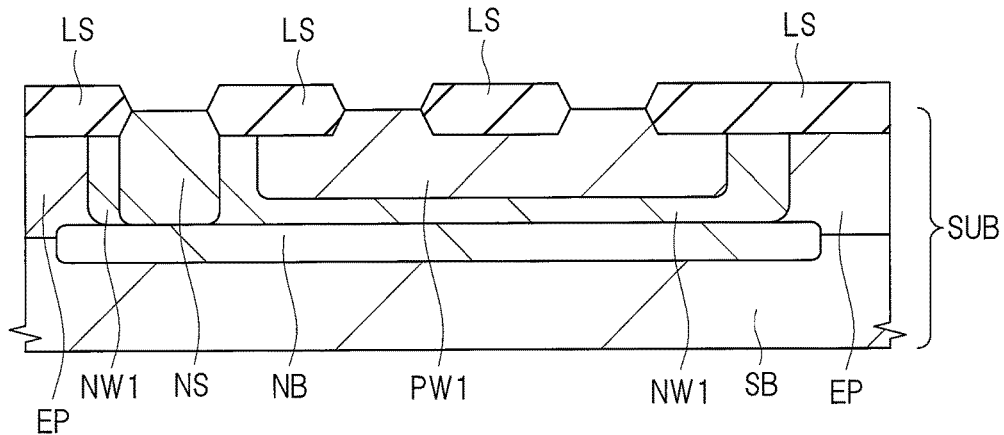
FIG. 12 is a cross-sectional view of the main part during the manufacturing process of the semiconductor device subsequently to FIG. 10.
Figure 13:
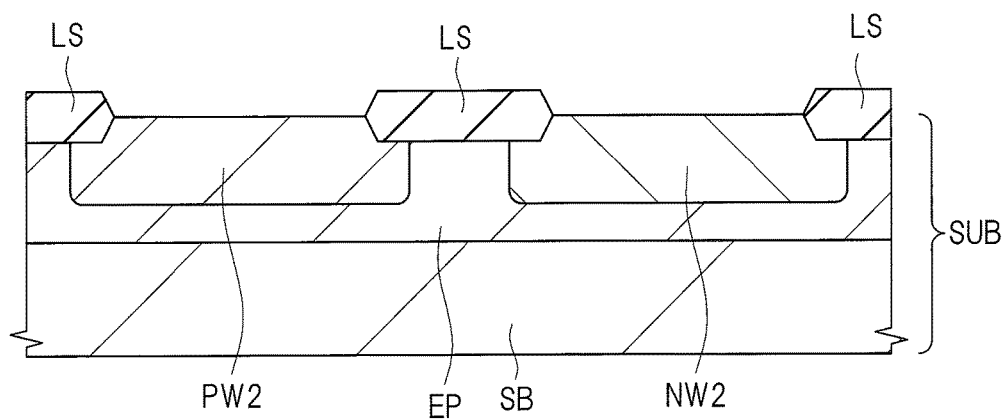
FIG. 13 is a cross-sectional view of the main part during the manufacturing process of the semiconductor device similar to FIG. 12.

Next, the $n^+$-type sinker region NS is formed in the epitaxial layer EP of the semiconductor substrate SUB in the bipolar transistor forming region 1A as illustrated in FIGS. 12 and 13. The $n^+$-type sinker region NS can be formed as follows, for example.

That is, it is possible to form the $n^+$-type sinker region NS by introducing an n-type impurity such as phosphorus (P) in an $n^+$-type sinker region NS formation-planned region of the epitaxial layer EP using the ion implantation method and thermally diffusing the introduced n-type impurity. At this time, the thermal diffusion is performed until the bottom surface (the lower surface) of the $n^+$-type sinker region NS reaches the $n^+$-type buried region NB, and thus, the $n^+$-type sinker region NS is in the state of being formed on the $n^+$-type buried region NB to be in contact with the $n^+$-type buried region NB. Thus, the $n^+$-type sinker region NS is in contact with the upper surface of the $n^+$-type buried region NB. The $n^+$-type sinker region NS is formed from the front surface of the epitaxial layer EP to the upper surface of the $n^+$-type buried region NB. In the epitaxial layer EP, the $n^+$-type sinker region NS is formed in the n-type well NW1, and the impurity concentration of the n'-type sinker region NS (the n-type impurity concentration) is higher than the impurity concentration (the n-type impurity concentration) of the n-type well NW1.

Next, the p-type well PW1 is formed in the epitaxial layer EP of the semiconductor substrate SUB in the bipolar transistor forming region LA. The p-type well PW1 can be formed by performing ion implantation of a p-type impurity such as boron (B), and it is possible to perform thermal diffusion after the ion implantation, while it is also possible to omit the thermal diffusion in a case in which there is no need of forming a depth of the p-type well PW1 so deeply. In the epitaxial layer EP, the p-type well PW1 is formed in the n-type well NW1 from the front surface of the epitaxial layer EP to have a predetermined depth.

Since a depth of the bottom surface of the p-type well PW1 is shallower than a depth of the bottom surface of the n-type well NW1, the n-type well NW1 is present immediately below the p-type well PW1, and further, the $n^+$-type buried region NB is present immediately below the n-type well NW1. The p-type well PW1 and the n'-type sinker region NS are spaced apart from each other, and thus, the n-type well NW1 is present between the p-type well PW1 and the $n^+$-type sinker region NS.

Next, the p-type well PW2 is formed in the epitaxial layer EP of the semiconductor substrate SUB in the nMOSFET forming region 1B, and the n-type well NW2 is formed in the epitaxial layer EP of the semiconductor substrate SUB in the pMOSFET forming region 1C.

The p-type well PW2 can be formed by performing ion implantation of a p-type impurity such as boron (B), and the n-type well NW2 can be formed by performing ion implantation of an n-type impurity such as phosphorus (P). It is possible to perform thermal diffusion after the ion implantation, but it is also possible to omit the thermal diffusion in a case in which there is no need to forming each depth of the p-type well PW2 and the n-type well NW2 so deeply.

In addition, it is possible to form the p-type well PW1 and the p-type well PW2 in the same process in a case in which the p-type well PW1 and the p-type well PW2 may be formed to have the same impurity concentration and the same depth. In addition, in a case in which the p-type well PW2 and the p-type well PW1 are formed in different processes, the p-type well PW1 may be formed first, or the p-type well PW2 may be formed first.

Figure 14:
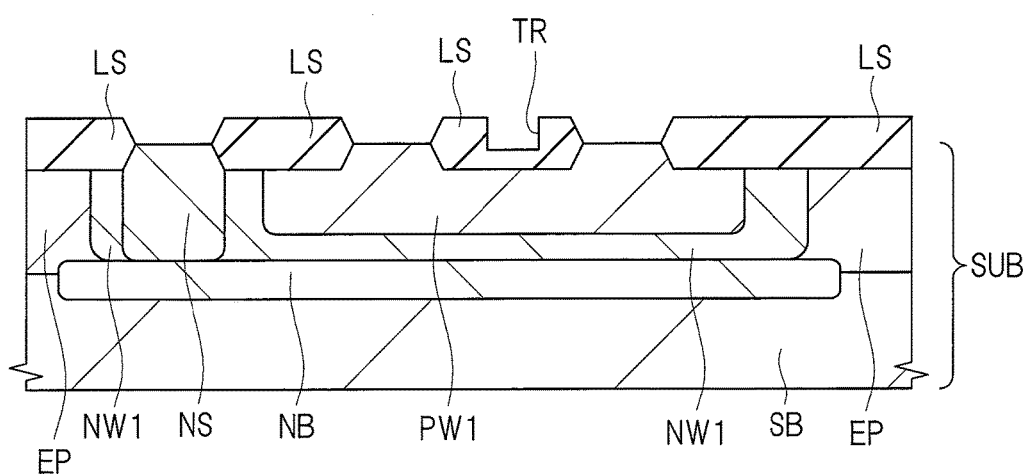
FIG. 14 is a cross-sectional view of the main part during the manufacturing process of the semiconductor device subsequently to FIG. 12.
Figure 15:
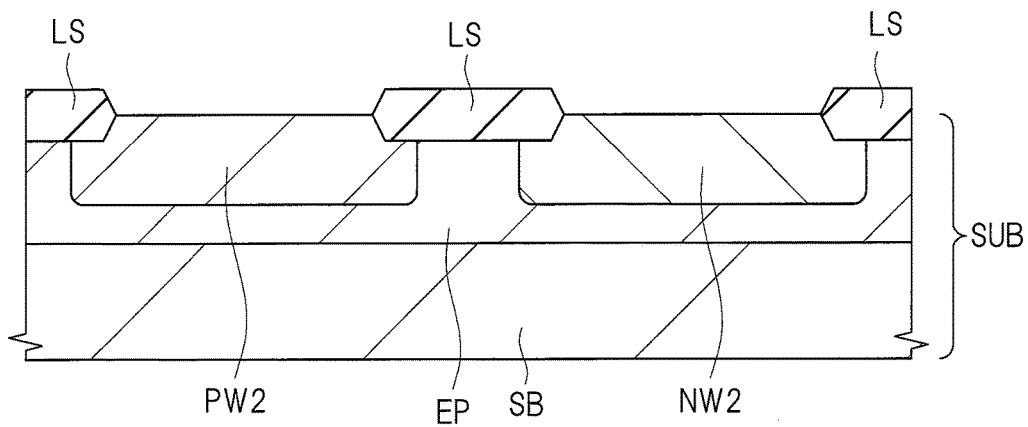
FIG. 15 is a cross-sectional view of the main part during the manufacturing process of the semiconductor device similar to FIG. 14.

Next, the trench TR is formed in the element isolation region LS as illustrated in FIGS. 14 and 15. The trench TR can be formed as follows, for example.

That is, a photoresist pattern (not illustrated) is formed on the main surface of the semiconductor substrate SUB using the photolithography method. This photoresist pattern has an opening portion to expose a region in which the trench TR is planned to be formed. Thereafter, by etching (for example, dry etching) the element isolation region LS with the photoresist pattern as an etching mask, the trench TR is formed in the element isolation region LS. Thereafter, the photoresist pattern is removed.

The trench TR is formed in the element isolation region LS of the bipolar transistor forming region 1A but does not pass through the element isolation region LS, and a bottom surface (lower surface) of the trench TR is positioned in the middle of the thickness of the element isolation region LS. Thus, the element isolation region LS is present immediately below the trench TR, but a thickness of the element isolation region LS immediately below the trench TR is by the depth of the trench TR smaller (thinner) than a thickness of the element isolation region LS in a region in which the trench TR is not formed.

Figure 16:
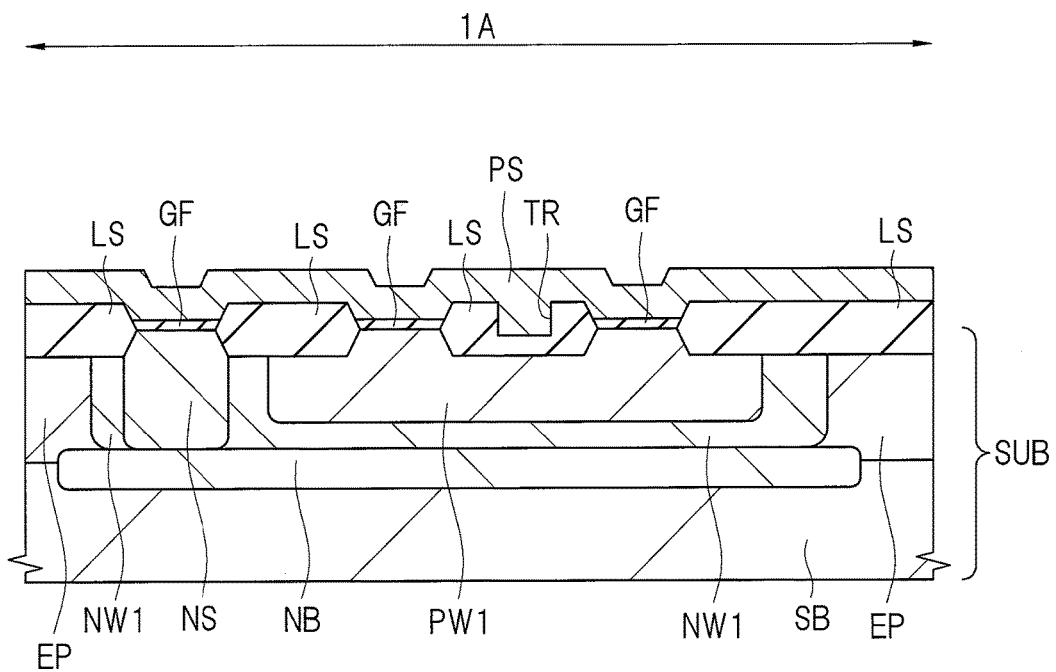
FIG. 16 is a cross-sectional view of the main part during the manufacturing process of the semiconductor device subsequently to FIG. 14.
Figure 17:
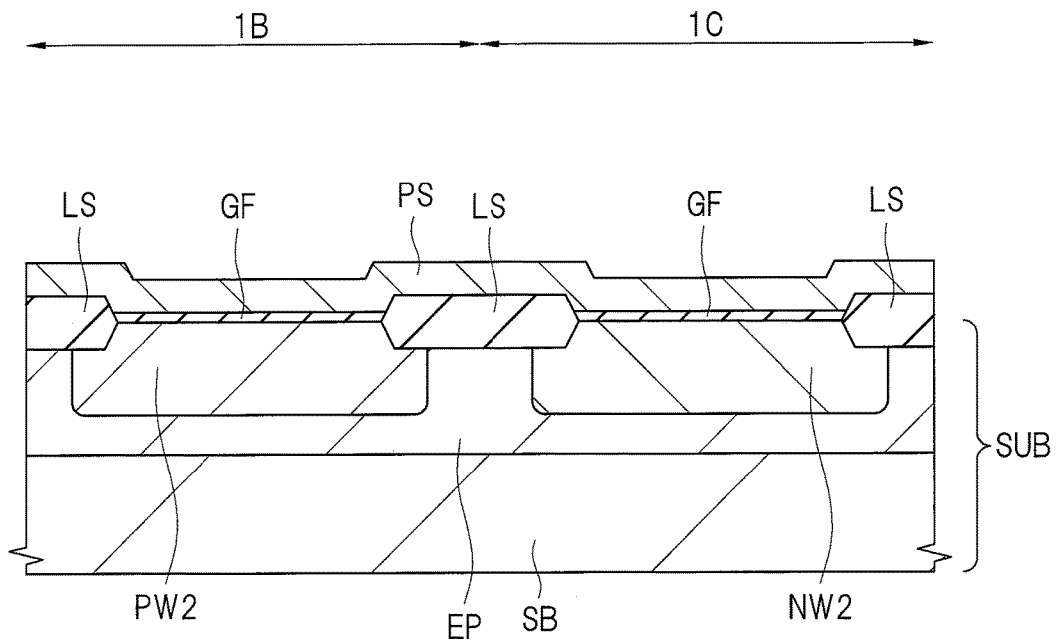
FIG. 17 is a cross-sectional view of the main part during the manufacturing process of the semiconductor device similar to FIG. 16.

Next, an insulating film GF for the gate insulating film is formed on the front surface of the epitaxial layer EP of the semiconductor substrate SUB as illustrated in FIGS. 16 and 17. The insulating film GF is made of a thin silicon oxide film and the like and can be formed using the thermal oxidation method or the like.

The insulating film GF is formed on the front surface of the epitaxial layer EP in a region in which the element isolation region LS is not formed. Thus, the insulating film GF is formed on the front surface of the epitaxial layer EP not only in the nMOSFET forming region 1B and the pMOSFET forming region 1C but also in the bipolar transistor forming region 1A. Although the insulating film GF in the nMOSFET forming region 1B and the pMOSFET forming region 1C is formed as the gate insulating film, the insulating film GF in the bipolar transistor forming region 1A is not used as the gate insulating film.

Next, a silicon film PS is formed (deposited) as the conductive film on the entire main surface of the semiconductor substrate SUB (that is, the entire main surface of the epitaxial layer EP), that is, on the insulating film GF and the element isolation region LS. At this time, the inside of the trench TR is buried with the silicon film PS.

The silicon film PS is made of a polycrystalline silicon film (polysilicon film) and can be formed using chemical vapor deposition (CVD) method or the like. At the time of the film deposition, the silicon film PS is formed as an amorphous silicon film, and it is possible to change the silicon film PS formed of the amorphous silicon film to the silicon film PS formed of the polycrystalline silicon film through the subsequent heat treatment. In addition, it is possible to form the silicon film PS as a semiconductor film (doped polysilicon film) with low resistance by performing ion implantation of an impurity in the silicon film PS or the like after the film deposition of the silicon film PS. At this time, it is preferable that an n-type impurity such as phosphorus (P) be introduced in the silicon film PS of the nMOSFET forming region 1B and the silicon film PS of the bipolar transistor forming region 1A and a p-type impurity such as boron (B) be introduced in the silicon film PS of the pMOSFET forming region 1C. The silicon film PS serves both functions as a conductive film for forming gate electrodes GE1 and GE2 and as a conductive film for forming the electrode FP.

Figure 18:
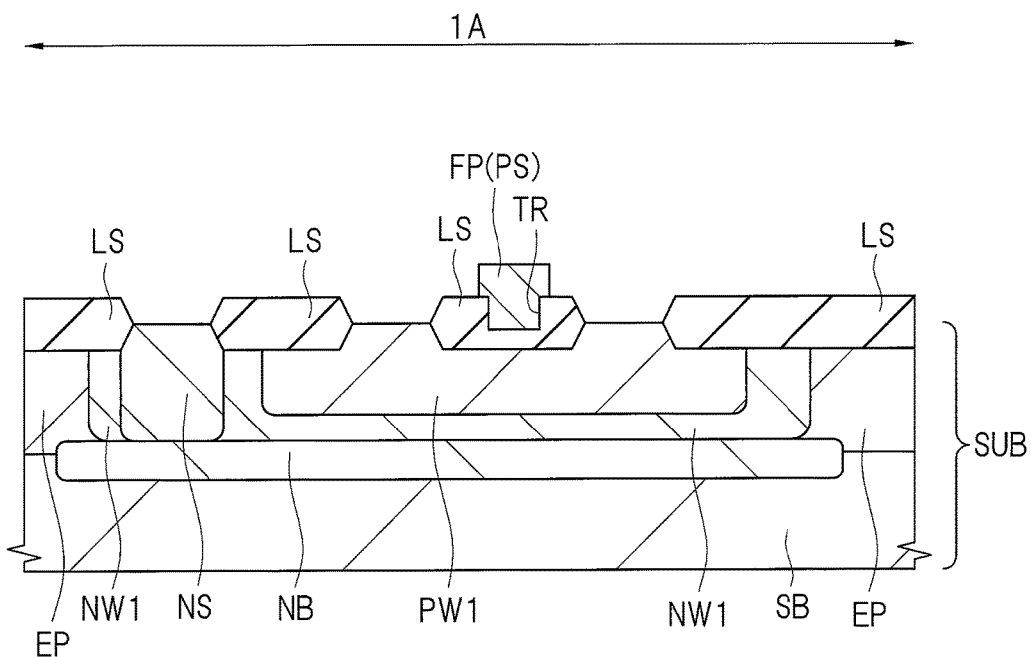
FIG. 18 is a cross-sectional view of the main part during the manufacturing process of the semiconductor device subsequently to FIG. 16.
Figure 19:
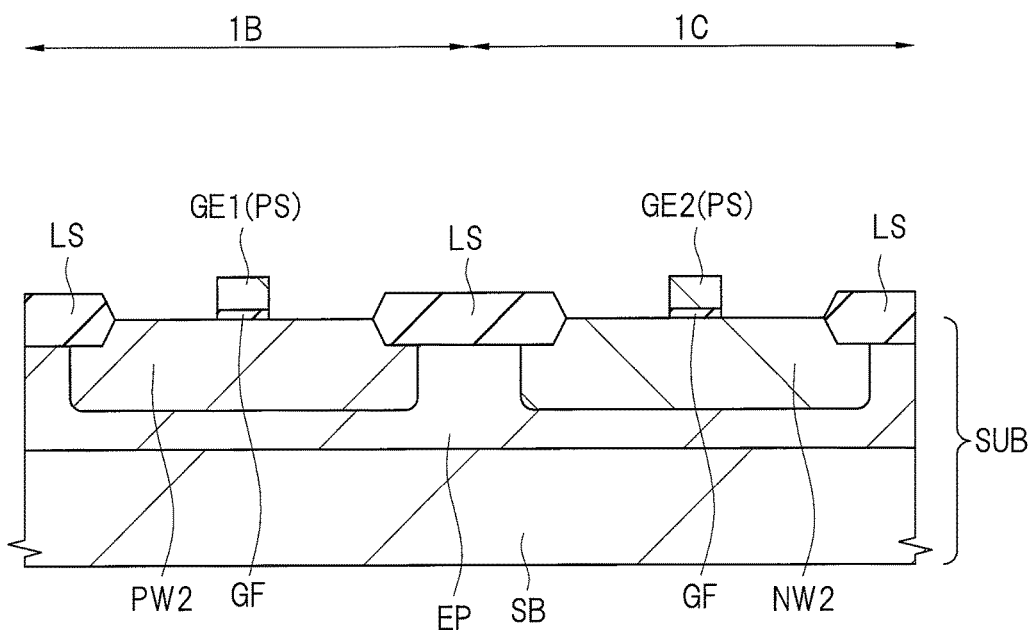
FIG. 19 is a cross-sectional view of the main part during the manufacturing process of the semiconductor device similar to FIG. 18.

Next, the electrode FP, the gate electrode GE1, and the gate electrode GE2 are formed by patterning the silicon film PS using the photolithography method and the etching method as illustrated in FIGS. 18 and 19.

Each of the electrode FP, the gate electrode GE1, and the gate electrode GE2 is formed of the patterned silicon film PS and can be formed in the same process using the common silicon film PS. The gate electrode GE1 is formed on the p-type well PW2 with the insulating film GF interposed therebetween in the nMOSFET forming region 1B, and the gate electrode GE2 is formed on the n-type well NW2 with the insulating film GF interposed therebetween in the pMOSFET forming region 1C. The electrode FP is formed on the element isolation region LS so as to be buried in the trench TR in the bipolar transistor forming region 1A.

In addition, it is possible to suppress an increase in the number of manufacturing processes of the semiconductor device since the electrode FP, and the gate electrodes GE1 and GE2 can be formed in the same process using the common conductive film (here, the silicon film PS).

The gate electrode GE1 becomes a gate electrode of an n-channel type MOSFET, and the insulating film GF remaining below the gate electrode GE1 becomes a gate insulating film of the n-channel type MOSFET. In addition, the gate electrode GE2 becomes a gate electrode of a p-channel type MOSFET, and the insulating film GF remaining below the gate electrode GE2 becomes a gate insulating film of the p-channel type MOSFET. The insulating film GF of a part which is not covered by the gate electrodes GE1 and GE2, can be removed by performing dry etching at the time of patterning the silicon film PS or wet etching after the dry etching.

Figure 20:
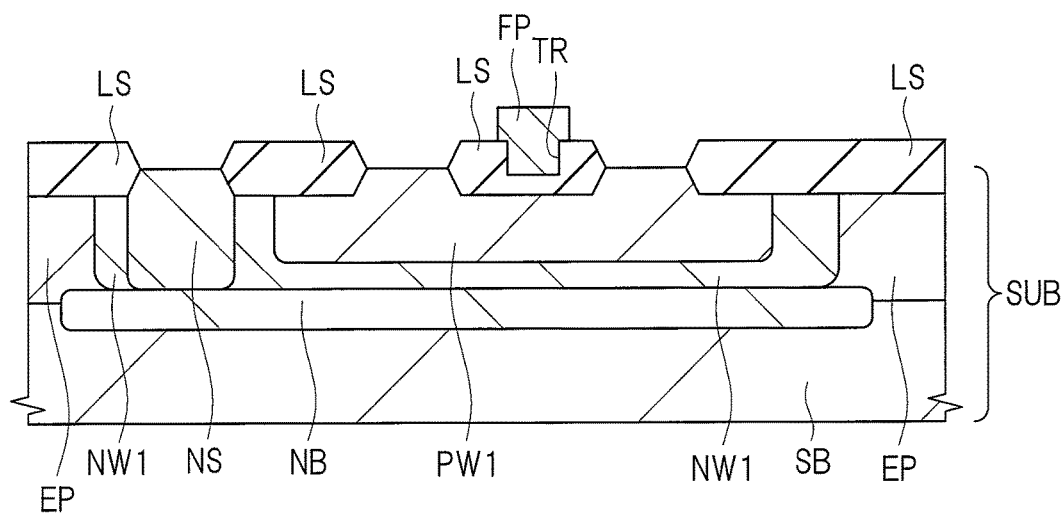
FIG. 20 is a cross-sectional view of the main part during the manufacturing process of the semiconductor device subsequently to FIG. 18.
Figure 21:
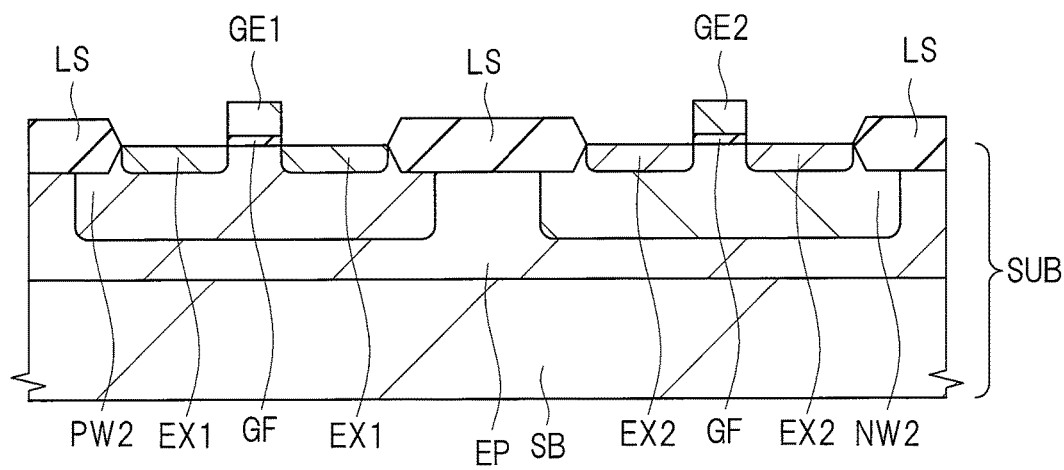
FIG. 21 is a cross-sectional view of the main part during the manufacturing process of the semiconductor device similar to FIG. 20.

Next, $n^-$-type semiconductor regions EX1 are respectively formed at both sides of the gate electrode GE1 in the p-type well PW2 by performing ion implantation of an n-type impurity such as arsenic (As) in the p-type well PW2 of the nMOSFET forming region 1B using the gate electrode GE1 as a mask as illustrated in FIGS. 20 and 21. In addition, $p^-$-type semiconductor regions EX2 are respectively formed at both sides of the gate electrode GE2 in the n-type well NW2 by performing ion implantation of a p-type impurity such as boron (B) in the n-type well NW2 of the pMOSFET forming region 1C using the gate electrode GE2 as a mask. Either of the ion implantations to form the $n^-$-type semiconductor regions EX1 or the ion implantation to form the $p^-$-type semiconductor regions EX2 may be performed first.

Figure 22:
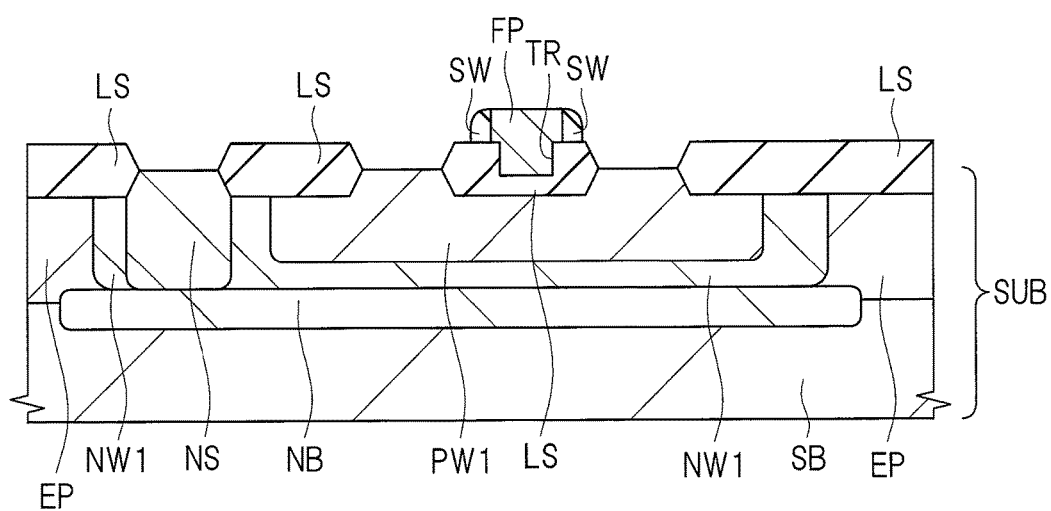
FIG. 22 is a cross-sectional view of the main part during the manufacturing process of the semiconductor device subsequently to FIG. 20.
Figure 23:
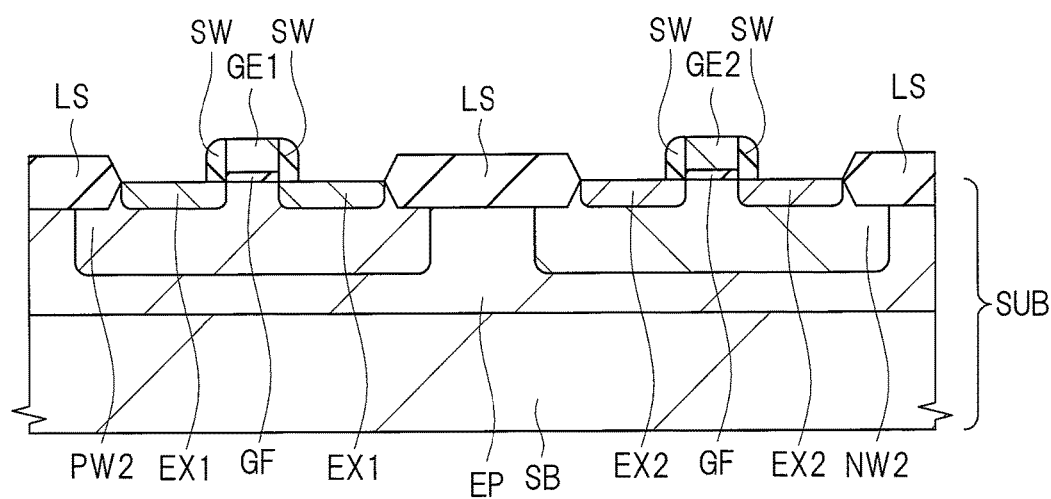
FIG. 23 is a cross-sectional view of the main part during the manufacturing process of the semiconductor device similar to FIG. 22.

Next, as illustrated in FIGS. 22 and 23, an insulating film for formation of a sidewall spacer is formed on the main surface of the semiconductor substrate SUB so as to cover the electrode FP and the gate electrodes GE1 and GE2, and then, the insulating film is anisotropically etched, thereby forming a sidewall spacer (sidewall insulating film) SW on each sidewall of the gate electrodes GE1 and GE2. At this time, the sidewall spacers SW can be formed not only on the sidewalls of the gate electrodes GE1 and GE2 but also on sidewalls of the electrode FP.

Figure 24:
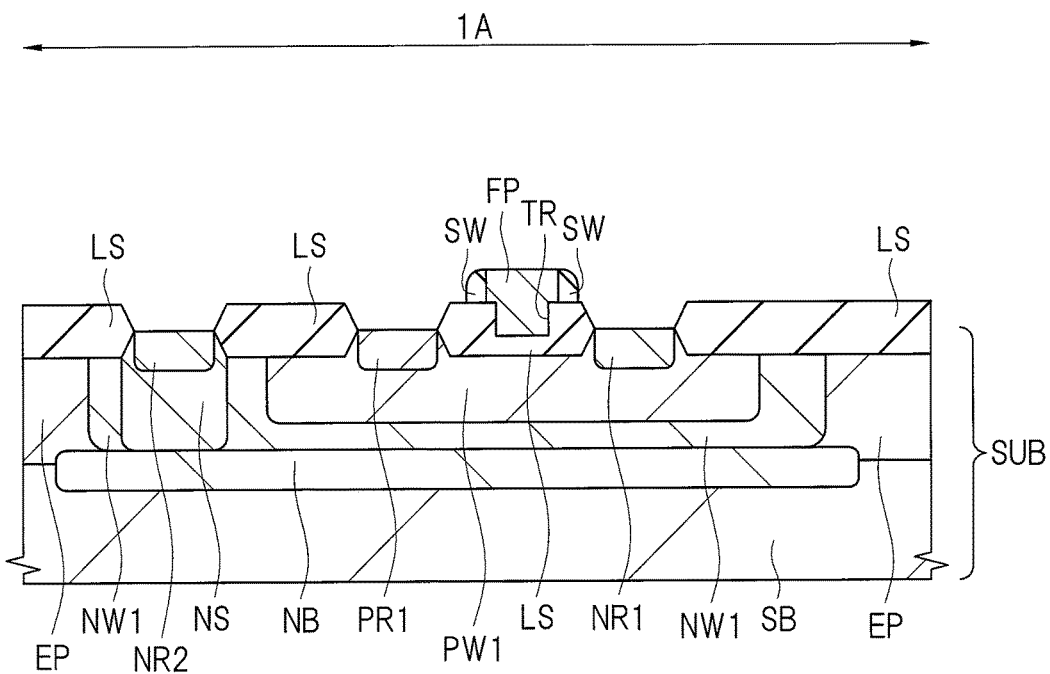
FIG. 24 is a cross-sectional view of the main part during the manufacturing process of the semiconductor device subsequently to FIG. 22.
Figure 25:
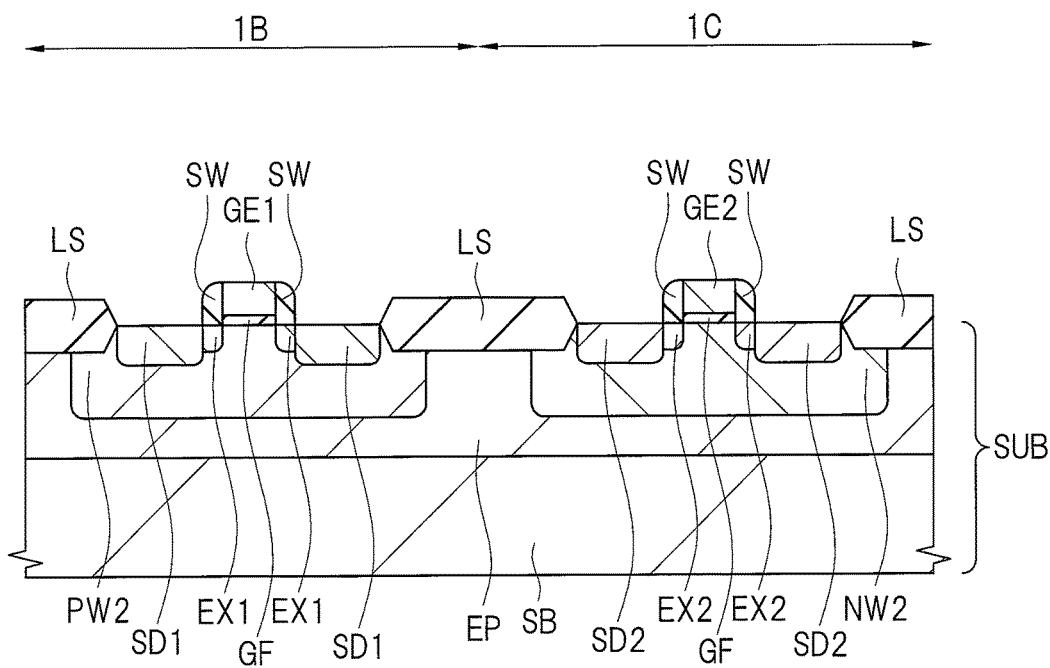
FIG. 25 is a cross-sectional view of the main part during the manufacturing process of the semiconductor device similar to FIG. 24.

Next, as illustrated in FIGS. 24 and 25, $n^+$-type semiconductor regions SD1 are respectively formed at both sides of a structural body including the gate electrode GE1 and the sidewall spacers SW on the sidewalls of the gate electrode GE1 in the p-type well PW2 by performing ion implantation of an n-type impurity such as arsenic (As) in the p-type well PW2 of the nMOSFET forming region 1B using the gate electrode GE1 and the sidewall spacers SW on the sidewalls of the gate electrode GE1 as a mask. In addition, $p^+$-type semiconductor regions SD2 are respectively formed at both sides of a structural body including the gate electrode GE2 and the sidewall spacers SW on the sidewalls of the gate electrode GE2 in the n-type well NW2 by performing ion implantation of a p-type impurity such as boron (B) in the n-type well NW2 of the pMOSFET forming region 1C using the gate electrode GE2 and the sidewall spacers SW on the sidewalls of the gate electrode GE2 as a mask.

The $n^+$-type semiconductor regions SD1 have a deeper junction depth and a higher impurity concentration (n-type impurity concentration) than the $n^-$-type semiconductor regions EX1, and in addition, the $p^+$-type semiconductor regions SD2 have a deeper junction depth and a higher impurity concentration (p-type impurity concentration) than the $p^-$-type semiconductor regions EX2. Source and drain regions having a lightly doped drain (LDD) structure of the n-channel MOSFET are formed using the $n^-$-type semiconductor regions EX1 and the $n^+$-type semiconductor regions SD1 in the nMOSFET forming region 1B. In addition, source and drain regions having the LDD structure of the p-channel MOSFET are formed using the $p^-$-type semiconductor regions EX2 and the $p^+$-type semiconductor regions SD2 in the pMOSFET forming region 1C.

In addition, the $n^+$-type semiconductor region NR1 and the $n^+$-type semiconductor region NR2 are formed as well as the $n^+$-type semiconductor regions SD1 are formed in the nMOSFET forming region 1B at the time of the ion implantation to form the $n^+$-type semiconductor regions SD1 by performing the ion implantation of the n-type impurity in the epitaxial layer EP of the bipolar transistor forming region 1A. In addition, the $p^+$-type semiconductor region PR1 is formed as well as the p$^+$-type semiconductor regions SD2 are formed in the pMOSFET forming region 1C at the time of the ion implantation to form the p$^+$-type semiconductor regions SD2 by performing the ion implantation of the p-type impurity in the epitaxial layer EP of the bipolar transistor forming region 1A.

In other words, the n$^+$-type semiconductor region NR1 and the n$^+$-type semiconductor region NR2 of the bipolar transistor forming region 1A are formed through the common ion implantation process along with the n$^+$-type semiconductor regions SD1 of the nMOSFET forming region 1B, and in addition, the p$^+$-type semiconductor region PR1 of the bipolar transistor forming region 1A is formed through the common ion implantation process along with the p$^+$-type semiconductor regions SD2 of the pMOSFET forming region 1C.

The entire pMOSFET forming region 1C and a region of the bipolar transistor forming region 1A in which the p$^+$-type semiconductor region PR1 needs to be formed should be covered by photoresist patterns at the time of the ion implantation to form the n$^+$-type semiconductor regions SD1, the n$^+$-type semiconductor region NR1, and the n$^+$-type semiconductor region NR2. In addition, the entire nMOSFET forming region 1B and regions of the bipolar transistor forming region 1A in which the n$^+$-type semiconductor regions NR1 and NR2 need to be formed should be covered by photoresist patterns at the time of the ion implantation to form the p$^+$-type semiconductor regions SD2 and the p$^+$-type semiconductor region PR1. In addition, either of the ion implantation to form the n$^+$-type semiconductor regions SD1, the n$^+$-type semiconductor region NR1, and the n$^+$-type semiconductor region NR2 or the ion implantation to form the p$^+$-type semiconductor regions SD2 and the p$^+$-type semiconductor region PR1 may be performed first.

Next, activation annealing is performed as heat treatment for activating the impurities that have been introduced so far.

Next, each metal silicide layer (not illustrated) is formed, if necessary, on each front surface (surface layer part) of the n$^+$-type semiconductor regions SD1, the p$^+$-type semiconductor regions SD2, the n$^+$-type semiconductor region NR1, the n$^+$-type semiconductor region NR2, the p$^+$-type semiconductor region PR1, the gate electrode GE1, and the gate electrode GE2 according to a self-aligned silicide (Salicide) technique or the like. If the metal silicide layer is formed, the contact resistance or the like can be reduced, but the formation of the metal silicide layer can be omitted.

Figure 26:
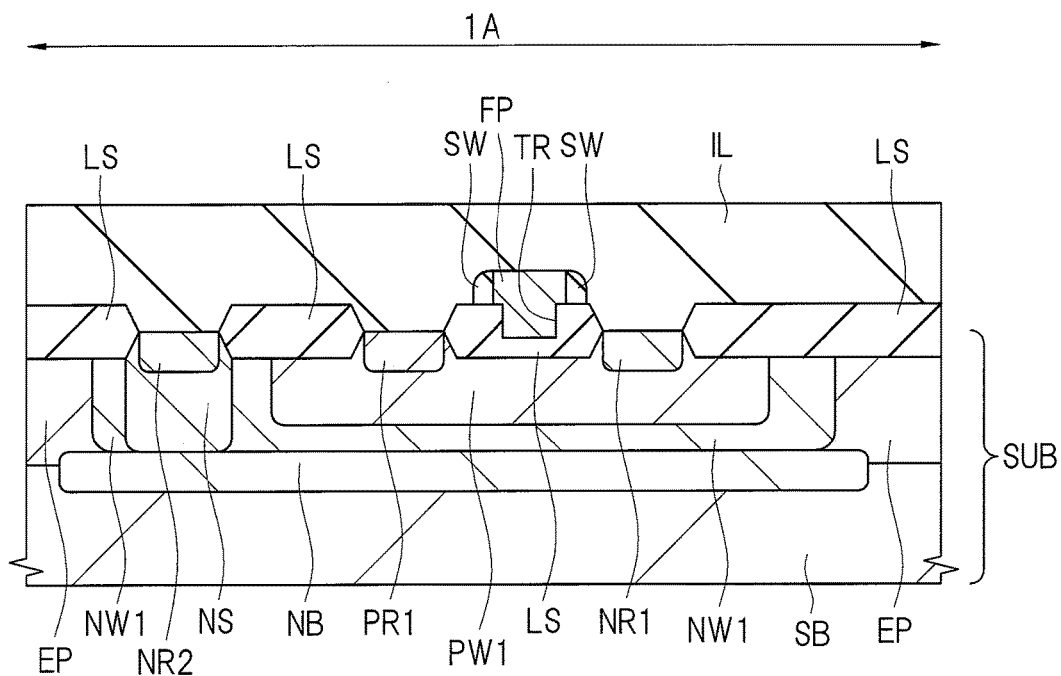
FIG. 26 is a cross-sectional view of the main part during the manufacturing process of the semiconductor device subsequently to FIG. 24.
Figure 27:
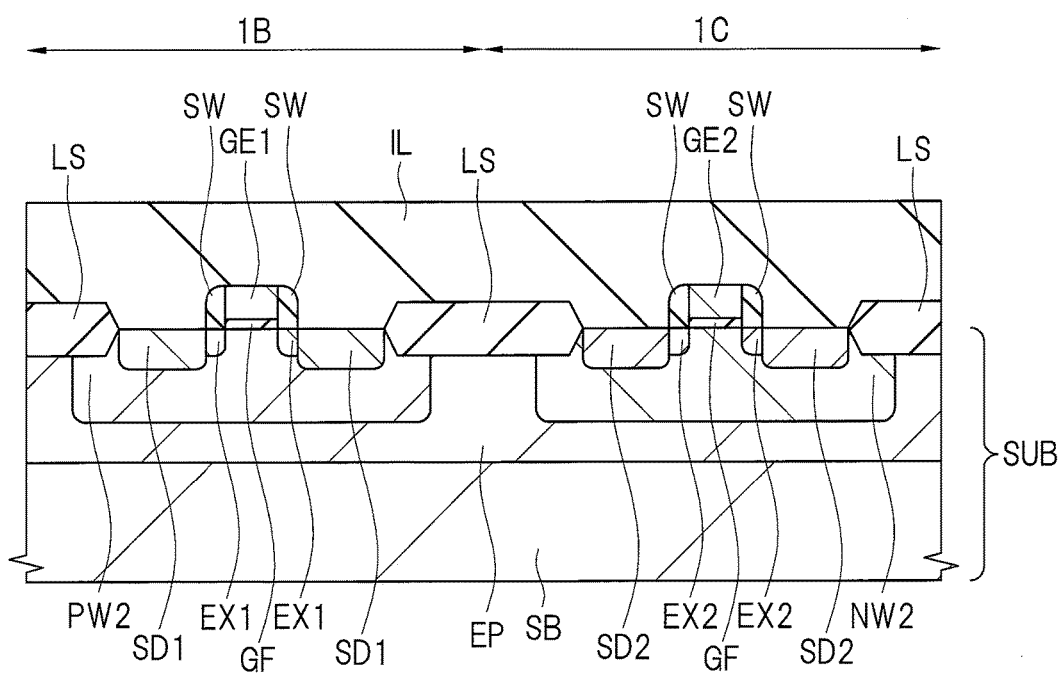
FIG. 27 is a cross-sectional view of the main part during the manufacturing process of the semiconductor device similar to FIG. 26.

Next, as illustrated in FIGS. 26 and 27, the interlayer insulating film IL is formed as the insulating film on the main surface of the semiconductor substrate SUB, that is, on the epitaxial layer EP, so as to cover the element isolation region LS, the electrode FP, the gate electrodes GE1 and GE2, and the sidewall spacers SW. The interlayer insulating film IL is made of, for example, the silicon oxide film or the like and can be formed using the CVD method or the like. It is also possible to use the laminated insulating film as the interlayer insulating film IL. It is possible to enhance flatness of the upper surface of the interlayer insulating film IL by polishing the upper surface of the interlayer insulating film IL using the CMP method after the film deposition of the interlayer insulating film IL.

Figure 28:
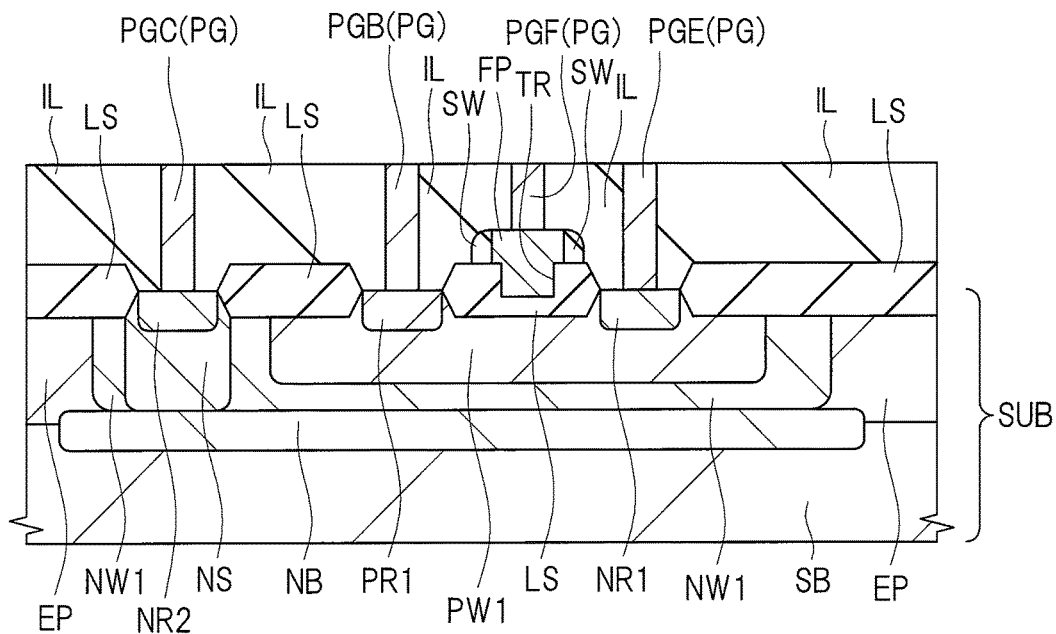
FIG. 28 is a cross-sectional view of the main part during the manufacturing process of the semiconductor device subsequently to FIG. 26.
Figure 29:
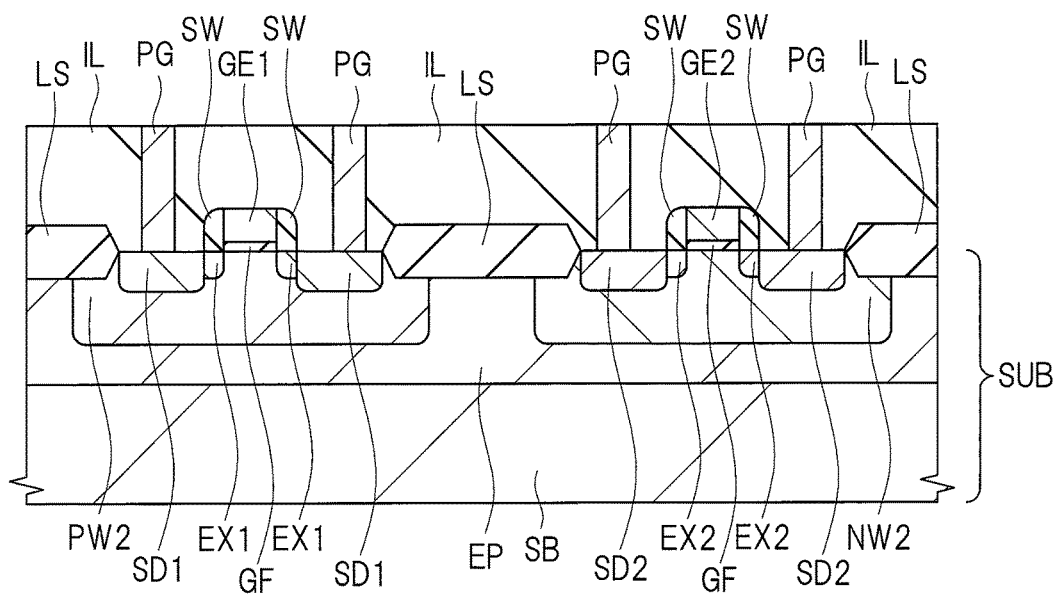
FIG. 29 is a cross-sectional view of the main part during the manufacturing process of the semiconductor device similar to FIG. 28.

Next, as illustrated in FIGS. 28 and 29, the contact holes are formed in the interlayer insulating film IL. The contact holes can be formed, for example, by dry-etching the interlayer insulating film IL with a photoresist pattern (not illustrated) which is formed on the interlayer insulating film IL using the photolithography method as an etching mask. The contact holes pass through the interlayer insulating film IL.

Next, the conductive plugs PG made of tungsten (W) or the like are formed in the contact holes of the interlayer insulating film IL as a conductor part for connection.

For example, a barrier conductor film is formed on the interlayer insulating film IL including insides (on a bottom portion and a sidewall) of the contact holes when forming the plugs PG. This barrier conductor film is made of, for example, a titanium film, a titanium nitride film, or a laminated film thereof. Thereafter, a main conductor film made of a tungsten film or the like is formed on the barrier conductor film so as to be buried in the contact holes. Thereafter, unnecessary main conductive film and barrier conductor film outside the contact holes are removed using the CMP method, an etch-back method, or the like, and accordingly, it is possible to form the plugs PG formed of the remaining main conductive film and barrier conductor film buried in the contact holes. Note that, in order for simplification of the drawings, FIGS. 28, and 29 illustrate such that the barrier conductive film and the main conductor film forming the plugs PG are integrated.

The emitter plug PGE, the base plug PGB, the collector plug PGC, and the plug PGF are formed as the plugs PG in the bipolar transistor forming region 1A. The emitter plug PGE is formed on the n$^+$-type semiconductor region NR1 and is electrically connected to the n$^+$-type semiconductor region NR1, and the base plug PGB is formed on the p$^+$-type semiconductor region PR1 and is electrically connected to the p$^+$-type semiconductor region PR1. In addition, the collector plug PGC is formed on the n$^+$-type semiconductor region NR2 and is electrically connected to the n$^+$-type semiconductor region NR2, and the plug PGF is formed on the electrode FP and is electrically connected to the electrode FP. The plug PG is formed on each of the n$^+$-type semiconductor regions SD1 and the gate electrode GE1 in the nMOSFET forming region 1B, and the plug PG is formed on each of the p$^+$-type semiconductor regions SD2 and the gate electrode GE2 in the pMOSFET forming region 1C.

Figure 30:
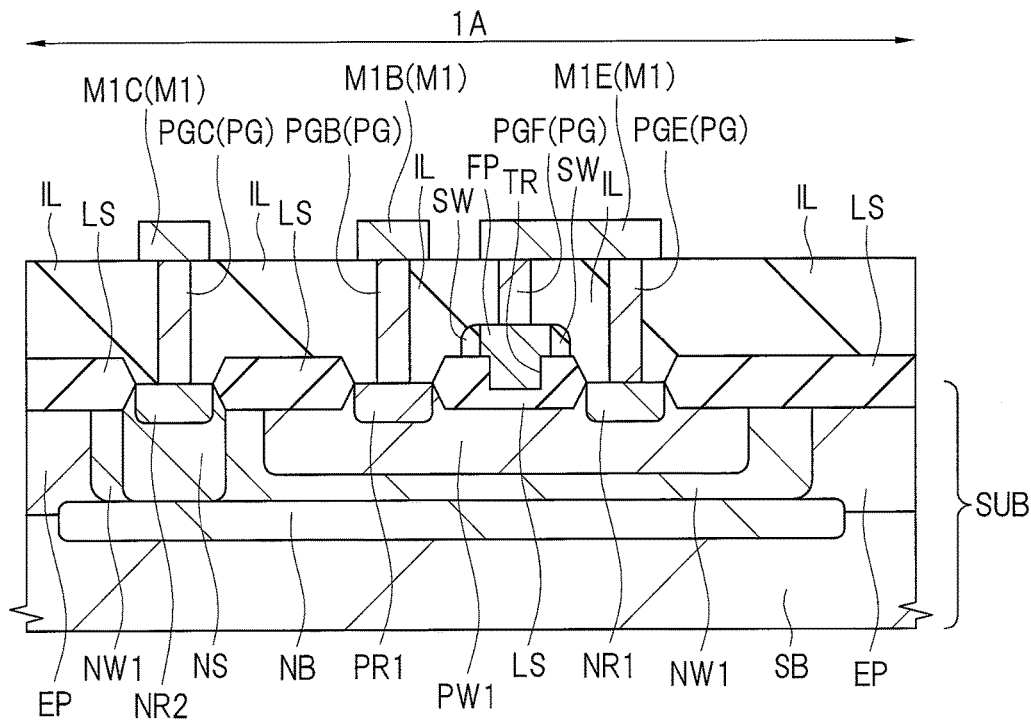
FIG. 30 is a cross-sectional view of the main part during the manufacturing process of the semiconductor device subsequently to FIG. 28.
Figure 31:
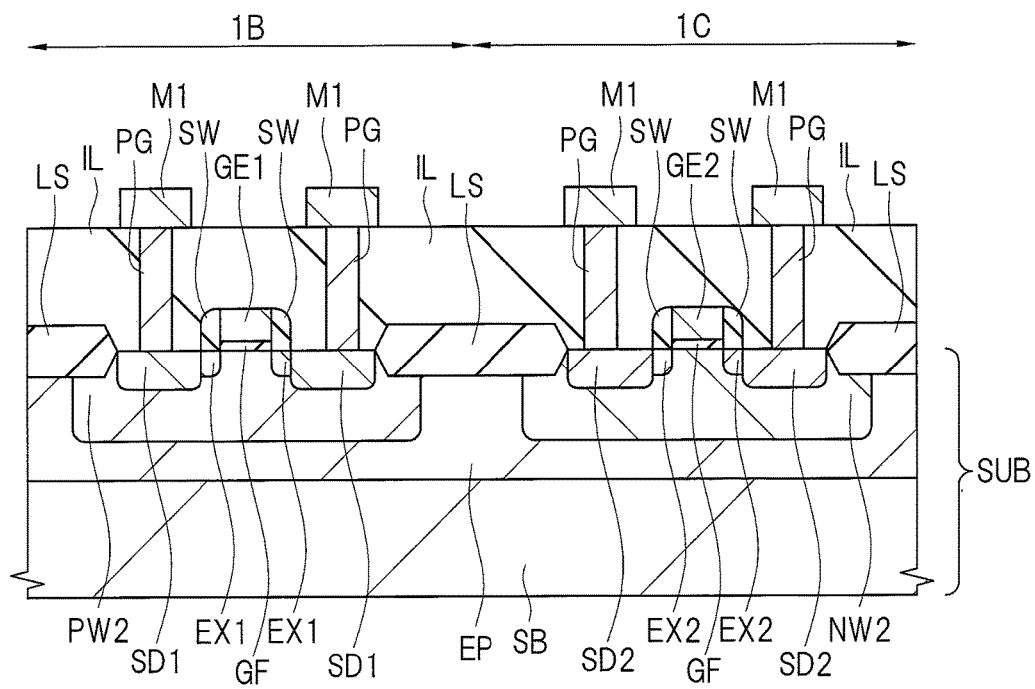
FIG. 31 is a cross-sectional view of the main part during the manufacturing process of the semiconductor device similar to FIG. 30.

Next, as illustrated in FIGS. 30 and 31, the wire M1 which are the wire at the first layer are formed on the interlayer insulating film IL in which the plugs PG are buried.

The wire M1 can be formed as follows, for example. That is, a laminated conductive film in which a barrier conductor film, a main conductor film, and a barrier conductor film are laminated in this order is first formed on the interlayer insulating film IL in which the plugs PG are buried. The barrier conductor film is made of, for example, a titanium film, a titanium nitride film, or a laminated film thereof, and the main conductor film is made of, for example, a conductive film (an aluminum film or an aluminum alloy film) having aluminum as a main body. Thereafter, the laminated conductive film is subjected to patterning using the photolithography method and the dry etching method, and accordingly, it is possible to form the wires M1 formed of the patterned laminated conductive film. In order for simplification of the drawings, FIGS. 30 and 31 illustrate the wires M1 in which the barrier conductive film and the main conductor film are integrated.

The emitter wire M1E, the base wire M1B, and the collector wire M1C are formed as the wires M1 in the bipolar transistor forming region 1A. The emitter wire M1E is electrically connected to the n$^+$-type semiconductor region NR1 via the emitter plug PGE and electrically connected to the electrode FP via the plug PGF. In addition, the base wire M1B is electrically connected to the p⁺-type semiconductor region PR1 via the base plug PGB, and the collector wire M1C is electrically connected to the n⁺-type semiconductor region NR2 via the collector plug PGC. In addition, the wires M1 are formed also in the nMOSFET forming region 1B and the pMOSFET forming region 1C, and the wires M1 are electrically connected to the n⁺-type semiconductor regions SD1, the p⁺-type semiconductor regions SD2, the gate electrode GE1, the gate electrode GE2, or the like via the plugs PG.

In addition, although the description has been made regarding a case in which the wires M1 are formed by patterning the conductive film here, it is possible to use the damascene wire (the buried wire) formed using the damascene method as the wires M1 in another mode.

Thereafter, the interlayer insulating film and the wire of a further upper layer are formed, but the illustration and description thereof will be omitted here.

<Regarding Study Examples>

Figure 32:
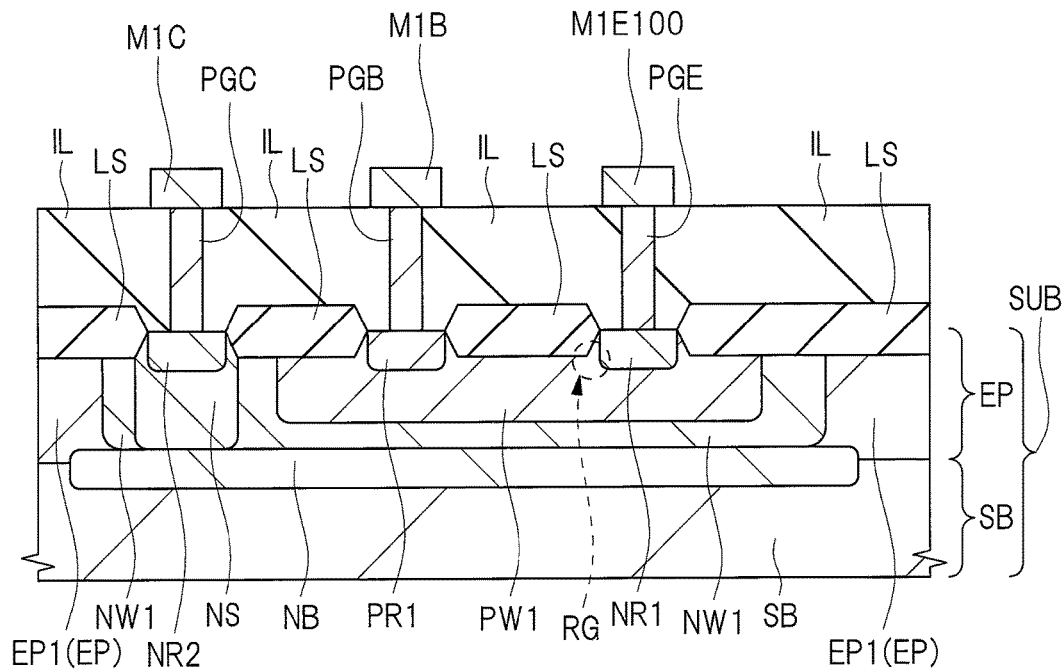
FIG. 32 is a cross-sectional view of a main part of a semiconductor device according to a first study example.

A description will be given regarding semiconductor devices of study examples that have been studied by the present inventor. FIG. 32 is a cross-sectional view of a main part of a semiconductor device according to a first study example that has been studied by the present inventor, FIG. 33 is a cross-sectional view of a main part of a semiconductor device according to a second study example that has been studied by the present inventor, and both illustrate the cross-sectional views corresponding to FIG. 1 of the present embodiment described above.

Figure 33:
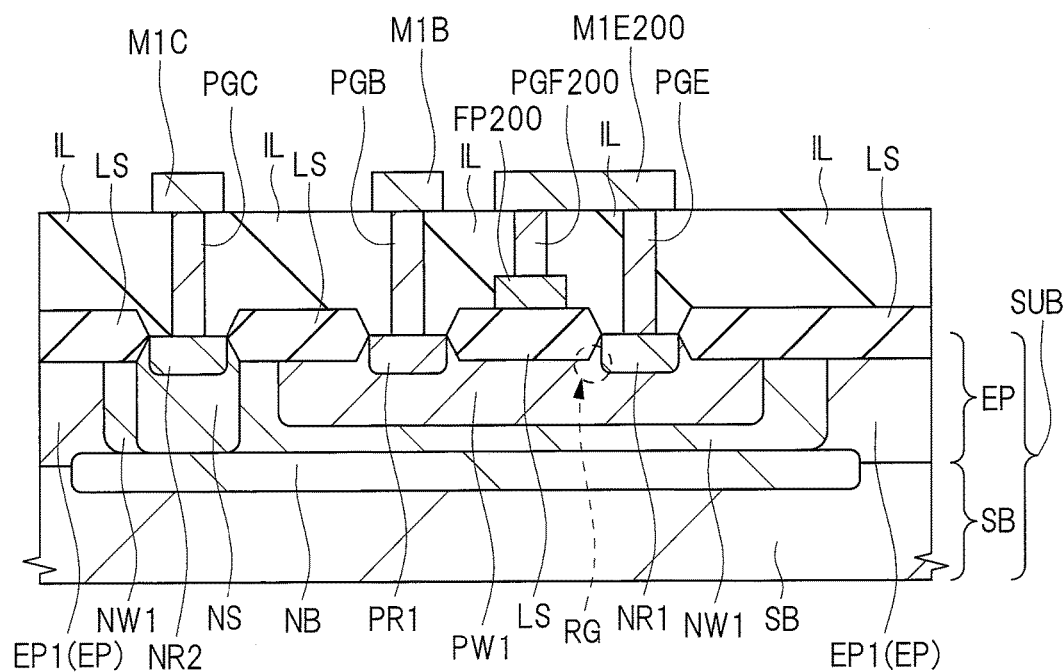
FIG. 33 is a cross-sectional view of a main part of a semiconductor device according to a second study example.

Each of the semiconductor device of the first study example illustrated in FIG. 32 and the semiconductor device of the second study example illustrated in FIG. 33 is a semiconductor device which has a bipolar transistor.

In the semiconductor device of the first study example illustrated in FIG. 32, apart corresponding to the above-described electrode FP is not formed, and accordingly, a part corresponding to the above-described trench TR and a part corresponding to the above-described plug PGF are not formed, either. Accordingly, an emitter wire M1E100 is formed instead of the above-described emitter wire M1E on the interlayer insulating film IL in the semiconductor device of the first study example illustrated in FIG. 32.

The semiconductor device of the first study example illustrated in FIG. 32 is substantially the same as the semiconductor device of FIGS. 1 to 3 regarding the other configurations, and the repetitive description thereof will be omitted here.

The semiconductor device of the first study example illustrated in FIG. 32 is substantially the same as the semiconductor device of FIGS. 1 to 3 regarding the configuration of the bipolar transistor. That is, similarly to the semiconductor device of FIGS. 1 to 3, the n⁺-type semiconductor region NR1 functions as the emitter region of the bipolar transistor, and the p-type well PW1 and the p⁺-type semiconductor region PR1 function as the base region of the bipolar transistor also in the semiconductor device of the first study example illustrated in FIG. 32. In addition, the n-type well NW1, the n⁺-type buried region NB, the n⁺-type sinker region NS, and the n⁺-type semiconductor region NR2 function as the collector region of the bipolar transistor. In other words, the base region is disposed to surround the emitter region, and the collector region is disposed to surround the base region. The emitter voltage is supplied from the emitter plug PGE to the n⁺-type emitter semiconductor region NR1, the base voltage is supplied from the base plug PGB to the p⁺-type base semiconductor region PR1, and the collector voltage is supplied from the collector plug PGC to the n⁺-type collector semiconductor region NR2.

Similarly to the semiconductor device of FIGS. 1 to 3, the element isolation region LS is formed on the main surface of the semiconductor substrate SUB between the n⁺-type, emitter semiconductor region NR1 and the p⁺-type base semiconductor region PR1 also in the semiconductor device of the first study example illustrated in FIG. 32.

When a reverse bias is applied between the emitter and the base in the bipolar transistor, there are problems that an hFE characteristic (a current amplification factor: a ratio of a collector current with respect to abase current) deteriorates and characteristics of the bipolar transistor deteriorate.

To be specific, when the reverse bias is applied between the emitter and the base, a hot carrier (here, a hole) is generated due to electric field concentration caused by a depletion layer extending from the emitter to the base side. According to simulation of the present inventor, when the reverse bias is applied between the emitter and the base, the electric field concentration occurs, and the hot carrier is likely to be generated in a region indicated by reference numeral RG in FIG. 32. The generated hot carrier is trapped (captured) in the nearby element isolation region LS, and there is a risk that the hot carrier is left in the state of being trapped in the element isolation region LS even after stopping the application of the reverse bias. This causes an adverse effect at the time of general operation of the bipolar transistor (a forward bias is applied between the emitter and the base in the general operation). For example, an electron from the emitter is recombined with the hole that has been trapped in the element isolation region LS in the course of moving to the collector side, which leads to an increase of the base current, and accordingly, the hFE characteristic (the current amplification factor) is degraded, so that the characteristics of the bipolar transistor are degraded. In addition, there is another risk that the hot carrier, generated due to the electric field concentration when the reverse bias is applied between the emitter and the base, collides with the nearby interface between the element isolation region LS and the semiconductor substrate SUB (the epitaxial layer EP) to cause damage, which also causes an adverse effect at the time of general operation of the bipolar transistor.

In recent years, there has been a demand for high reliability, for example, in application for vehicles, and semiconductor devices with the high reliability in which characteristics of bipolar transistors do not deteriorate even when a reverse bias is applied have been required.

Although a forward bias is applied between the emitter and the base at the time of normal operation of the bipolar transistor, it is required that the characteristics at the time of the normal operation of the bipolar transistor do not deteriorate (change) when the reverse bias is applied between the emitter and the base in order to improve the reliability.

Thus, the present inventor has been studied regarding the semiconductor device of the second study example illustrated in FIG. 33.

In the semiconductor device of the second study example illustrated in FIG. 33, an electrode FP200 is formed on the element isolation region LS between the n⁺-type emitter semiconductor region NR1 and the p⁺-type base semiconductor region PR1 as a field plate electrode. This electrode FP200 is electrically connected to an emitter wire M1E200 via a plug PGF200.

The emitter wire M1E200 corresponds to the above-described emitter wire M1E, is electrically connected to the n⁺-type emitter semiconductor region NR1 via the emitter plug PGE, and is electrically connected to the electrode FP200 via the plug PGF200. In other words, the electrode FP200 and the n$^+$-type emitter semiconductor region NR1 are electrically connected to each other via the plug PGF200, the emitter wire M1E200, and the emitter plug PGE. Thus, the same voltage (emitter voltage) is applied to the electrode FP200 and the n$^+$-type emitter semiconductor region NR1, and both have substantially the same potential.

The electrode FP200 in the second study example illustrated in FIG. 33 is different from the above-described electrode FP in terms of the following points. That is, while the electrode FP is buried in the trench TR formed in the element isolation region LS, a part corresponding to the trench TR is not formed in, the element isolation region LS in the semiconductor device of the second study example illustrated in FIG. 33, and accordingly, the electrode FP200 is not buried in a trench of the element isolation region LS but is disposed on the element isolation region LS in which the trench is not formed.

In the case of the second study example illustrated in FIG. 33, a voltage which is the same as a voltage to be supplied to the n$^+$-type emitter semiconductor region NR1 is supplied to the electrode FP200. Thus, in a case in which the reverse bias is applied between the emitter and the base, it is possible to promote the extension of the depletion layer from the emitter to the base side, and thus, it is possible to mitigate the electric field concentration in the second study example illustrated in FIG. 33 than the first study example illustrated in FIG. 32. That is, in a case in which the reverse bias is applied between the emitter and the base, the electric field concentration occurs so that the hot carrier is likely to be generated in the region indicated by reference numeral RG in the first study example illustrated in FIG. 32, and as compared to the above, the electric field concentration hardly occurs in the region RG so that it is possible to suppress the generation of the hot carrier in the second study example illustrated in FIG. 33.

Thus, since the electric field concentration at the time of applying the reverse bias between the emitter and the base can be mitigated and the generation of the hot carrier can be suppressed by providing the electrode FP200, the above-described problem accompanying the generation of the hot carrier hardly occurs in the second study example illustrated in FIG. 33 than the first study example illustrated in FIG. 32.

It is necessary to dispose the electrode FP200 on the element isolation region LS between the n$^+$-type emitter semiconductor region NR1 and the p$^+$-type base semiconductor region PR1. However, a distance between the electrode FP200 and a substrate region (here, the p-type well PW1) increases when a thickness of the element isolation region LS is thick, which weakens the effect of mitigating the electric field concentration at the time of applying the reverse bias between the emitter and the base and the effect of suppressing the generation of the hot carrier according to the provision of the electrode FP200. Conversely, when the entire thickness of the element isolation region LS is formed to be thin, an effect of improving a withstand voltage between the emitter and the base by providing the element isolation region LS between the n$^+$-type emitter semiconductor region NR1 and the p$^+$-type base semiconductor region PR1 is weakened. In other words, in the case of the second study example in which the electrode FP200 is formed on the element isolation region LS between the n$^+$-type emitter semiconductor region NR1 and the p$^+$-type base semiconductor region PR1, it is advantageous to reduce the thickness of the element isolation region LS in order to enhance the effect of mitigating the electric field concentration according to the electrode FP200 while it is advantageous to thicken the thickness of the element isolation region LS in order to improve the withstand voltage between the emitter and the base. Thus, in the structure of the second study example illustrated in FIG. 33, it is difficult to obtain both advantageous effects that mitigation of the electric field concentration according to the electrode FP200 is improved as much as possible and that the withstand voltage between the emitter and the base is improved as much as possible. That is, it is difficult to sufficiently demonstrate mitigation effect of the electric field concentration according to the electrode FP200 in the structure of the second study example illustrated in FIG. 33.

<Regarding Main Feature and Effect>

The semiconductor device according to the present embodiment is the semiconductor device provided with the bipolar transistor and includes the semiconductor substrate SUB, the p-type well PW1 (a first semiconductor region) formed in the semiconductor substrate SUB, and the p$^+$-type semiconductor region PR1 (a second semiconductor region) and the n$^+$-type semiconductor region NR1 (a third semiconductor region) which are formed in the p-type well PW1 so as to be spaced apart from each other. The semiconductor device according to the present embodiment further includes the element isolation region LS (the element isolation insulating film) formed on the main surface of the semiconductor substrate SUB between the p$^+$-type semiconductor region PR1 and the n$^+$-type semiconductor region NR1 and the electrode FP (a first electrode) formed on the element isolation region LS. The semiconductor device according to the present embodiment further includes the interlayer insulating film IL formed on the semiconductor substrate SUB so as to cover the element isolation region LS and the electrode FP, and the emitter plug PGE (a first plug), the plug PGF (a second plug), and the base plug PGB (a third plug) which are buried in the interlayer insulating film IL.

The impurity concentration of the p$^+$-type semiconductor region PR1 is higher than the impurity concentration of the p-type well PW1, the p-type well PW1 and the p$^+$-type semiconductor region PR1 are the base semiconductor regions of the bipolar transistor, and the n$^+$-type semiconductor region NR1 is the emitter semiconductor region of the bipolar transistor. The emitter plug PGE is disposed on the n$^+$-type semiconductor region NR1 and is electrically connected to the n$^+$-type semiconductor region NR1, the plug PGF is disposed on the electrode FP and is electrically connected to the electrode FP, and the base plug PGB is disposed on the p$^+$-type semiconductor region PR1 and is electrically connected to the p$^+$-type semiconductor region PR1. The emitter plug PGE and the plug PGF are electrically connected to each other. When seen in a plan view, the electrode FP is formed between the p$^+$-type semiconductor region PR1 and the n$^+$-type semiconductor region NR1, and at least a part of the electrode FP is buried in the trench TR (a first trench) which is formed in the element isolation region LS.

One of the main features of the present embodiment is that the electrode FP is formed on the element isolation region LS between the p$^+$-type semiconductor region PR1 and the n$^+$-type semiconductor region NR1 when seen in a plan view.

Unlike the present embodiment, in a case in which the part corresponding to the electrode FP (the field plate electrode) is not formed on the element isolation region LS between the p$^+$-type semiconductor region PR1 and the n$^+$-type semiconductor region NR1 like the first study example of FIG. 32, the problem that the characteristics of the bipolar transistor deteriorates occurs when the reverse bias is applied between the emitter and the base as described with reference to the first study example of FIG. 32. This is because the electric field concentration occurs and the hot carrier is generated in the region RG in FIG. 32 when the reverse bias is applied between the emitter and the base as described above.

On the contrary, in the present embodiment, when seen in a plan view, the electrode FP is formed on the element isolation region LS between the $n^+$-type emitter semiconductor region NR1 and the $p^+$-type base semiconductor region PR1. Since the electrode FP is electrically connected to the $n^+$-type emitter semiconductor region NR1 via the plug PGF and the plug PGE, the voltage (the emitter voltage) to be supplied to the $n^+$-type emitter semiconductor region NR1 is supplied also to the electrode FP. That is, the electrode FP becomes substantially the same potential as that of the $n^+$-type emitter semiconductor region NR1. Thus, by providing the electrode FP on the element isolation region LS between the $n^+$-type emitter semiconductor region NR1 and the $p^+$-type base semiconductor region PR1, it is possible to promote the extension of the depletion layer from the emitter to the base side in a case in which the reverse bias is applied between the emitter and the base, and thus, it is possible to mitigate the electric field concentration (in particular, the electric field concentration in the region indicated by reference numeral RG in FIGS. 32 and 33). Accordingly, it is possible to suppress the generation of the hot carrier (here, the hole) due to the electric field concentration in a case in which the reverse bias is applied between the emitter and the base. Note that the p-type well PW1 for the base having the lower impurity concentration than the $p^+$-type semiconductor region PR1 extends below the element isolation region LS positioning between the $n^+$-type emitter semiconductor, region NR1 and the $p^+$-type base semiconductor region PR1.

Another one of the main features of the present embodiment is that at least a part of the electrode FP is buried in the trench TR formed in the element isolation region LS.

Unlike the present embodiment, in a case in which the part corresponding to the trench TR is not formed in the element isolation region LS like the second study example of FIG. 33 and the electrode FP200 is formed on the element isolation region LS in which the trench is not formed, the thick element isolation region LS is interposed between the electrode FP200 and the substrate region (here, the p-type well PW1), which is different from the present embodiment. Thus, the effect of mitigating the electric field concentration at the time of applying the reverse bias between the emitter and the base and the effect of suppressing the generation of the hot carrier according to the provision of the electrode FP200 are weakened. Conversely, when the entire thickness of the element isolation region LS is formed to be thin, the effect of improving the withstand voltage between the emitter and the base by providing the element isolation region LS between the $n^+$-type emitter semiconductor region NR1 and the $p^+$-type base semiconductor region PR1 is weakened.

On the contrary, in the present embodiment, the electrode FP is formed on the element isolation region LS between the $n^+$-type emitter semiconductor region NR1 and the $p^+$-type base semiconductor region PR1, and at least a part of the electrode FP is buried in the trench TR formed on the element isolation region LS. It is possible to decrease the distance (interval) between the electrode FP buried in the trench TR and the substrate region (here, the p-type well PW1) while securing the thickness of the element isolation region LS by burying the electrode FP in the trench TR of the element isolation region LS. Thus, it is possible to enhance the effect of mitigating the electric field concentration at the time of applying the reverse bias between the emitter and the base and the effect of suppressing the generation of the hot carrier by reducing the distance (interval) between the electrode FP buried in the trench TR and the substrate region (here, the p-type well PW1), as well as it is possible to enhance the withstand voltage between the emitter and the base by securing the thickness of the element isolation region LS.

That is, it is assumed that a thickness (T2) of the element isolation region LS in the region in which the trench TR is not formed in the semiconductor device according to the present embodiment of FIG. 1 is the same as a thickness of the element isolation region LS in the second study example illustrated in FIG. 33. In this case, the effect of improving the withstand voltage between the emitter and the base by providing the element isolation region LS between the $n^+$-type emitter semiconductor region NR1 and the $p^+$-type base semiconductor region PR1 is substantially the same between the semiconductor device according to the present embodiment of FIG. 1 and the semiconductor device of the second study example of FIG. 33. However, in this case, a thickness (T1) of the element isolation region LS immediately below the electrode FP of the part buried in the trench TR in the semiconductor device according to the present embodiment of FIG. 1 is smaller than a thickness of the element isolation region LS immediately below the electrode FP200 in the second study example of FIG. 33. That is, a distance (interval) between the electrode FP and the substrate region (here, the p-type well PW1) in the semiconductor device according to the present embodiment of FIG. 1 is shorter than a distance (interval) between the electrode FP200 and the substrate region (here, the p-type well PW1) in the second study example of FIG. 33. The effect of enabling the mitigation of the electric field concentration when the reverse bias is applied between the emitter and the base by providing the electrodes FP and FP200 increases by shortening the distance (interval) between the electrode FP and the substrate region (here, the p-type well PW1). Thus, it is possible to mitigate the electric field concentration at the time of applying the reverse bias between the emitter and the base by providing the electrodes FP and FP200, and the mitigation effect of the electric field concentration is greater in the electrode FP of the present embodiment than in the electrode FP200 of the second study example of FIG. 33. That is, in the present embodiment, it is possible to more appropriately mitigate the electric field concentration (in particular, the electric field concentration in the region indicated by reference numeral RG in FIGS. 32 and 33) when the reverse bias is applied between the emitter and the base.

Note that the region indicated by reference numeral RG in FIGS. 32 and 33 substantially corresponds to a vicinity region of an emitter-side end portion of the lower surface of the element isolation region LS in the p-type well PW1, and an electric field is likely to be concentrated on this region in a case in which the reverse bias is applied between the emitter and the base. The electrodes FP and FP200 act to mitigate the electric field concentration in the region RG, and such action is greater in the electrode FP with the shorter distance to the p-type well PW1 than in the electrode FP200 with the longer distance to the p-type well PW1. Thus, the effect of enabling the suppression of generating the hot carrier (here, the hole) due to the electric field concentration in a case in which the reverse bias is applied between the emitter and the base is greater in the electrode FP (the present embodiment) with the shorter distance to the p-type well PW1 than the electrode FP200 (the second study example) with the longer distance to the p-type well PW1.

In other words, in the present embodiment, at least a part of the electrode FP is buried by providing the trench TR in the element isolation region LS between the $n^+$-type semiconductor region NR1 and the $p^+$-type semiconductor region PR1 in order to locally reduce the thickness of the element isolation region LS of the part positioning immediately below the electrode FP while securing the entire thickness of the element isolation region LS between the $n^+$-type emitter semiconductor region NR1 and the $p^+$-type base, semiconductor region PR1. Thus, the thickness T1 of the element isolation region LS immediately below the electrode FP in the part buried in the trench TR is smaller than the thickness T2 of the element isolation region LS in the region in which the trench TR is not formed (that is, T1<T2). Note that the thicknesses T1 and T2 are illustrated in FIG. 1, the thickness T1 corresponds to a thickness of the element isolation region LS in the bottom portion of the trench TR, the thickness T2 corresponds to a thickness of the element isolation region LS outside the trench TR, and a difference between the thickness T2 and the thickness T1 (that is, T2−T1) corresponds to the depth of the trench TR.

Accordingly, it is possible to obtain both the reduction in the thickness T1 of the element isolation region LS immediately below the electrode FP in the part buried in the trench TR and the increase of the thickness T2 of the element isolation region LS in the region in which the trench TR is not formed. Thus, it is possible to enhance the effect of mitigating the electric field concentration at the time of applying the reverse bias between the emitter and the base and the effect of suppressing the generation of the hot carrier by reducing the thickness T1 of the element isolation region LS immediately below the electrode FP in the part buried in the trench TR between the $n^+$-type emitter semiconductor region NR1 and the $p^+$-type base semiconductor region PR1 when seen in a plan view. Accordingly, it is possible to suppress the generation of the adverse effect at the time of the general operation of the bipolar transistor which is caused by the generation of the hot carrier when the reverse bias is applied between the emitter and the base, and, for example, it is possible to suppress the hFE characteristic from deteriorating. Accordingly, it is possible to improve a comprehensive reliability of the semiconductor device which has the bipolar transistor.

In this manner, in the present embodiment, the element isolation region LS is formed on the main surface of the semiconductor substrate SUB between the $n^+$-type emitter semiconductor region NR1 and the $p^+$-type base semiconductor region PR1, as well as the electrode FP electrically connected to the $n^+$-type emitter semiconductor region NR1 is disposed on the element isolation region LS, and at least a part of the electrode FP is buried in the trench TR formed in the element isolation region LS. Accordingly, it is possible to improve the withstand voltage between the emitter and the base, as well as it is possible to suppress the deterioration in the characteristics of the bipolar transistor in a case in which the reverse bias is applied between the emitter and the base. Accordingly, it is possible to improve a comprehensive reliability of the semiconductor device which has the bipolar transistor.

In addition, in the present embodiment, as described above, the electrode FP is formed between the $n^+$-type emitter semiconductor region NR1 and the $p^+$-type base semiconductor region PR1 when seen in a plan view, and it is preferable to form the trench TR as well between the $n^+$-type emitter semiconductor region NR1 and the $p^+$-type base semiconductor region PR1 when seen in a plan view. Accordingly, the electrode FP of the part buried in the trench TR is in the state of being disposed between the $n^+$-type emitter semiconductor region NR1 and the $p^+$-type base semiconductor region PR1 when seen in a plan view, and thus, it is possible to appropriately promote the extension of the depletion layer from the emitter to the base side by the electrode FP of the part buried in the trench TR in a case in which the reverse bias is applied between the emitter and the base. Thus, it is possible to appropriately mitigate the electric field concentration (in particular, the electric field concentration in the region indicated by reference numeral RG in FIGS. 32 and 33) in a case in which the reverse bias is applied between the emitter and the base. Accordingly, it is possible to more appropriately suppress the generation of the hot carrier (here, the hole) due to the electric field concentration in a case in which the reverse bias is applied between the emitter and the base. As a result, it is possible to appropriately suppress the deterioration in the characteristics of the bipolar transistor caused by the generation of the hot carrier, and thus, it is possible to more appropriately improve the reliability of the semiconductor device which has the bipolar transistor.

In addition, the semiconductor device according to the present embodiment further includes the emitter wire M1E (the first wire) and the base wire M1B (the second wire) formed on the interlayer insulating film IL. The emitter wire M1E is electrically connected to the $n^+$-type emitter semiconductor region NR1 via the emitter plug PGE and is electrically connected to the electrode FP via the plug PGF, and the base wire M1B is electrically connected to the $p^+$-type base semiconductor region PR1 via the base, plug PGB. Accordingly, it is possible to supply a desired base voltage from the base wire M1B to the pt-type base semiconductor region PR1 via the base plug PGB, and it is possible to, supply a desired emitter voltage from the emitter wire M1E to the $n^+$-type emitter semiconductor region NR1 via the emitter plug PGE, as well as it is possible to supply the same voltage as the emitter voltage to the electrode FP via the plug PGF. In other words, it is possible to appropriately fix the potential of the electrode FP to the same potential as the potential of the $n^+$-type emitter semiconductor region NR1. Thus, it is possible to appropriately promote the extension of the depletion layer from the emitter to the base side by the electrode FP from the emitter to the base side in a case in which the reverse bias is applied between the emitter and the base, and it is possible to appropriately mitigate the electric field concentration (in particular, the electric field concentration in the region indicated by reference numeral RG in FIGS. 32 and 33).

In addition, the semiconductor device according to the present embodiment further includes the n-type well NW1 (a fourth semiconductor region) formed in the semiconductor substrate SUB so as to enclose the p-type well PW1, the $n^+$-type semiconductor region NR2 (a fifth semiconductor region) formed in the n-type well NW1 so as to be spaced apart from the p-type well PW1, and the collector plug PGC (a fourth plug) buried in the interlayer insulating film IL. The n-type well NW1 and the $n^+$-type semiconductor region NR2 are the collector semiconductor regions. The impurity concentration of the $n^+$-type semiconductor region NR2 is higher than the impurity concentration of the n-type well NW1, and the collector plug PGC is disposed on the $n^+$-type semiconductor region NR2 and is electrically connected to the n⁺-type semiconductor region NR2. Accordingly, it is possible to appropriately form a vertical bipolar transistor.

In addition, the semiconductor device according to the present embodiment further includes the n⁺-type buried region NB (an n-type buried-type semiconductor region) which is formed in the semiconductor substrate SUB and is positioned below the n-type well NW1, and the n⁺-type buried region NB has a higher impurity concentration than the n-type well NW1. It is possible to reduce the collector resistance by providing the n⁺-type buried region NB having the higher impurity concentration than the n-type well NW1 below then-type well NW1.

In addition, the semiconductor device according to the present embodiment further includes the collector wire M1C (a third wire) formed on the interlayer insulating film IL, and the collector wire M1C is electrically connected to the n⁺-type semiconductor region NR2 via the collector plug PGC. Accordingly, it is possible to supply a desired collector voltage from the collector wire M1C to the n⁺-type collector semiconductor region NR2 via the collector plug PGC.

Figure 34:
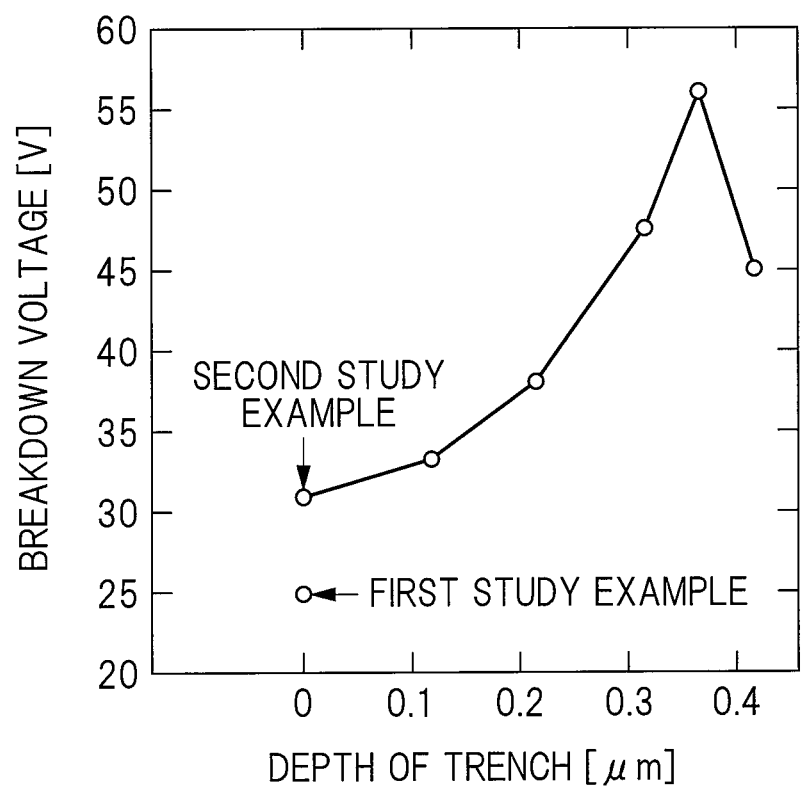
FIG. 34 is a graph illustrating a correlation between a depth of a trench in an element isolation region and a breakdown voltage between an emitter and a base.

FIG. 34 is a graph illustrating a correlation between a depth of the trench TR in the element isolation region LS and a breakdown voltage between the emitter and the base. The horizontal axis of the graph of FIG. 34 corresponds to the depth of the trench TR in the element isolation region LS, and the vertical axis of the graph of FIG. 34 corresponds to the breakdown voltage between the emitter and the base. Note that the graph of FIG. 34 assumes a case in which the thickness T2 of the element isolation region LS in the region in which the trench TR is not formed is 460 nm. Accordingly, a value obtained by subtracting a value of the horizontal axis of FIG. 34 from 460 nm, corresponds to the above-described thickness T1. That is, when a value of the horizontal axis of the graph of FIG. 34 is set to X nm, a value of (460−X) nm corresponds to the thickness T1. A value at the right end of the horizontal axis of the graph of FIG. 34 is 460 nm, and the trench TR exactly passes through the element isolation region LS there. In addition, a case in which a value in the horizontal axis of the graph of FIG. 34 is 0 (zero) corresponds to the case of the second study example of FIG. 33. In addition, the breakdown voltage in the case of the first study example of FIG. 32 is also illustrated in the graph of FIG. 34.

The vertical axis of the graph of FIG. 34 corresponds to the breakdown voltage when the reverse bias is applied between the emitter and the base, and a fact that this breakdown voltage (the vertical axis of the graph of FIG. 34) increases implies that the electric field concentration is mitigated when the reverse bias is applied between the emitter and the base. That is, the breakdown voltage (the vertical axis of the graph of FIG. 34) decreases if the electric field concentration occurs when the reverse bias is applied between the emitter and the base, and the breakdown voltage (the vertical axis of the graph of FIG. 34) tends to increase if the electric field concentration does not occur when the reverse bias is applied between the emitter and the base.

As apparent from the graph of FIG. 34, as compared to the case of the first study example of FIG. 32, the breakdown voltage (the vertical axis of the graph of FIG. 34) is higher in the case of the second study example of FIG. 33, which implies that the electrode FP200 described above acts to mitigate the electric field concentration. Thus, as apparent from the graph of FIG. 34, the breakdown voltage (the vertical axis of the graph of FIG. 34) becomes higher as the depth of the trench TR is set to be deeper in the case of providing the electrodes FP and FP200, which implies that the action that the electrode FP mitigates the electric field concentration increases as the depth of the trench TR is set to be deeper. In other words, it implies that, as compared to the case of the second study example of FIG. 33 which corresponds to a case in which the depth of the trench TR is zero, the breakdown voltage (the vertical axis of the graph of FIG. 34) increases in the present embodiment of FIG. 1 in which the trench TR is formed, and the action that the electrode FP of the present embodiment mitigates the electric field concentration is greater than the action that the electrode FP200 of the second study example mitigates the electric field concentration.

In addition, as apparent from the graph of FIG. 34, the breakdown voltage (the vertical axis of the graph of FIG. 34) increases as the depth of the trench TR is set to be deeper, that is, as the thickness T1 is reduced. This implies that the action that the electrode FP mitigates the electric field concentration increases as the depth of the trench TR is set to be deeper, that is, as the thickness T1 is reduced. Thus, it is effective to shorten the distance between the electrode FP and the substrate region (here, the p-type well PW1) by decreasing the thickness T1 in order to increase the action that the electrode FP mitigates the electric field concentration.

Thus, the depth of the trench TR is desirably set to be deeper to some extent, that is, the thickness T1 is desirably set to be smaller to some extent with respect to the thickness T2 of the element isolation region LS between the n⁺-type emitter semiconductor region NR1 and the p⁺-type base semiconductor region PR1 when seen in a plan view.

In this regard, it is more preferable when the thickness T1 is equal to or smaller than a half of the thickness T2. That is, it is more preferable that the thickness T1 of the element isolation region LS immediately below the electrode FP in the part buried in the trench TR be equal to or smaller than a half of the thickness T2 of the element isolation region LS in the region in which the trench TR is not formed (that is, $T1 \leq T2 \times 1/2$) in the element isolation region LS positioning between the n⁺-type emitter semiconductor region NR1 and the p⁺-type base semiconductor region PR1 when seen in a plan view. Accordingly, the withstand voltage between the emitter and the base is appropriately improved, and the thickness T1 of the element isolation region LS immediately below the electrode FP in the part buried in the trench TR is decreased, so that it is possible to more appropriately mitigate the electric field concentration at the time of applying the reverse bias between the emitter and the base and to more appropriately obtain the effect of suppressing the generation of the hot carrier. Accordingly, it is possible to more appropriately suppress the deterioration in the characteristics of the bipolar transistor in a case in which the reverse bias is applied between the emitter and the base, and it is possible to more appropriately improve the comprehensive reliability of the semiconductor device which has the bipolar transistor.

In addition, it is preferable that the thickness T1 of the element isolation region LS immediately below the electrode FP in the part buried in the trench TR be equal to or smaller than 200 nm (that is, T1 200 nm) in order to sufficiently enjoy the action that the electrode FP mitigates the electric field concentration.

In addition, as apparent from the graph of FIG. 34, although the breakdown voltage (the vertical axis of the graph of FIG. 34) increases as the depth of the trench TR is set to be deeper, that is, as the thickness T1 is reduced, the breakdown voltage (the vertical axis of the graph of FIG. 34) turns to decrease when the trench TR is set to be too deep, that is, when the thickness T1 is set to be too small. This implies that the electric field is likely to be concentrated on the portion immediately below the electrode FP when the distance between the electrode FP and the substrate region (here, the p-type well PW1) is set to be too short so that the action that the electrode FP mitigates the electric field concentration is reduced, and the distance between the electrode FP and the substrate region (here, the p-type well PW1) is desirably secured to be about equal to or longer than 50 nm. Thus, it is preferable that the thickness T1 of the element isolation region LS immediately below the electrode FP in the part buried in the trench TR be equal to or longer than 50 nm (that is, T1≥50 nm). Accordingly, it is possible to more appropriately mitigate the electric field concentration at the time of applying the reverse bias between the emitter and the base, and to more appropriately obtain the effect of suppressing the generation of the hot carrier. Accordingly, it is possible to more appropriately suppress the deterioration in the characteristics of the bipolar transistor in a case in which the reverse bias is applied between the emitter and the base, and it is possible to more appropriately improve the comprehensive reliability of the semiconductor device which has the bipolar transistor.

In addition, when the trench TR passes through the element isolation region LS in the process (the above-described process of FIG. 14) of forming the trench TR in the element isolation region LS, the electrode FP is short-circuited from the p-type well PW1, which leads to short-circuit between the n$^+$-type emitter semiconductor region NR1 and the p$^+$-type base semiconductor region PR1, and it is necessary to sort and eliminate a semiconductor device in which such a phenomenon occurs in an inspection process after the manufacture. This leads to reduction in a manufacturing yield of the semiconductor device. However, when the thickness (T1) of the element isolation region LS in the bottom portion of the trench TR is designed to be equal to or larger than 50 nm at the time of forming the trench TR, although there are some changes in the processes, the trench TR does not pass through the element isolation region LS, and it is possible to appropriately prevent the short-circuit between the electrode FP and the p-type well PW1. Accordingly, it is possible to improve the manufacturing yield of the semiconductor device.

Accordingly, it is most preferable that the thickness T1 of the element isolation region LS immediately below the electrode FP in the part buried in the trench TR be within a range of 50 to 200 nm (that is, 50 nm T1≥200 nm). Accordingly, it is possible to sufficiently demonstrate the action that the electrode FP mitigates the electric field concentration, and it is possible to more appropriately suppress the deterioration in the characteristics of the bipolar transistor in a case in which the reverse bias is applied between the emitter and the base. Accordingly, it is possible to more appropriately improve the comprehensive reliability of the semiconductor device which has the bipolar transistor.

Meanwhile, the thickness T2 of the element isolation region LS is preferably larger than 200 nm, and accordingly, it is possible to appropriately improve the withstand voltage between the emitter and the base. It is possible to set the thickness T2 to about 400 to 800 nm, for example, in a case in which the element isolation region LS is the LOCOS oxide film, and it is possible to set the thickness T2 to about 250 to 400 nm, for example in a case in which the element isolation region LS is the STI insulating film.

In addition, the end portion (the side surface) on the emitter side of the electrode FP is preferably spaced apart from the n$^+$-type emitter semiconductor region NR1 by equal to or more than 50 nm. That is, when seen in a plan view, an interval (distance) L1 between the electrode FP and the n$^+$-type emitter semiconductor region NR1 is preferably equal to or more than 50 nm (that is, L1≥50 nm). Here, the interval L1 is illustrated in FIG. 2. When the position of the end portion (the side surface) on the emitter side of the electrode FP is too close to the n$^+$-type emitter semiconductor region NR1, the electric field concentration is likely to occur in the vicinity of the end portion on the base side of the n$^+$-type emitter semiconductor region NR1, and it is difficult to obtain the mitigation effect of the electric field concentration according to the electrode FP. Thus, the interval L1 is preferably equal to or more than 50 nm (that is, L1≥50 nm), and accordingly, it is possible to more appropriately mitigate the electric field concentration at the time of applying the reverse bias between the emitter and the base and to more appropriately obtain the effect of suppressing the generation of the hot carrier, so that it is possible to more appropriately improve the comprehensive reliability of the semiconductor device.

In addition, the end portion (the side surface) on the base side of the electrode FP is preferably spaced apart from the p$^+$-type base semiconductor region PR1 by equal to or more than 50 nm. That is, when seen in a plan view, an interval (distance) L2 between the electrode FP and the p$^+$-type base semiconductor region PR1 is preferably equal to or more than 50 nm (that is, L2≥50 nm). Here, the interval L2 is illustrated in FIG. 2. When the position of the end portion (the side surface) on the base side of the electrode FP is too close to the p$^+$-type base semiconductor region PR1, there is a risk that the electric field is concentrated on the base side, and it is difficult to obtain the mitigation effect of the electric field concentration according to the electrode FP. Thus, the interval L2 is preferably equal to or more than 50 nm (that is, L2≥50 nm), and accordingly, it is possible to more certainly mitigate the electric field concentration at the time of applying the reverse bias between the emitter and the base, and to more appropriately obtain the effect of suppressing the generation of the hot carrier, so that it is possible to more appropriately improve the comprehensive reliability of the semiconductor device.

<Regarding Modified Examples>

Next, a description will be given regarding modified examples of the present embodiment.

Figure 35:
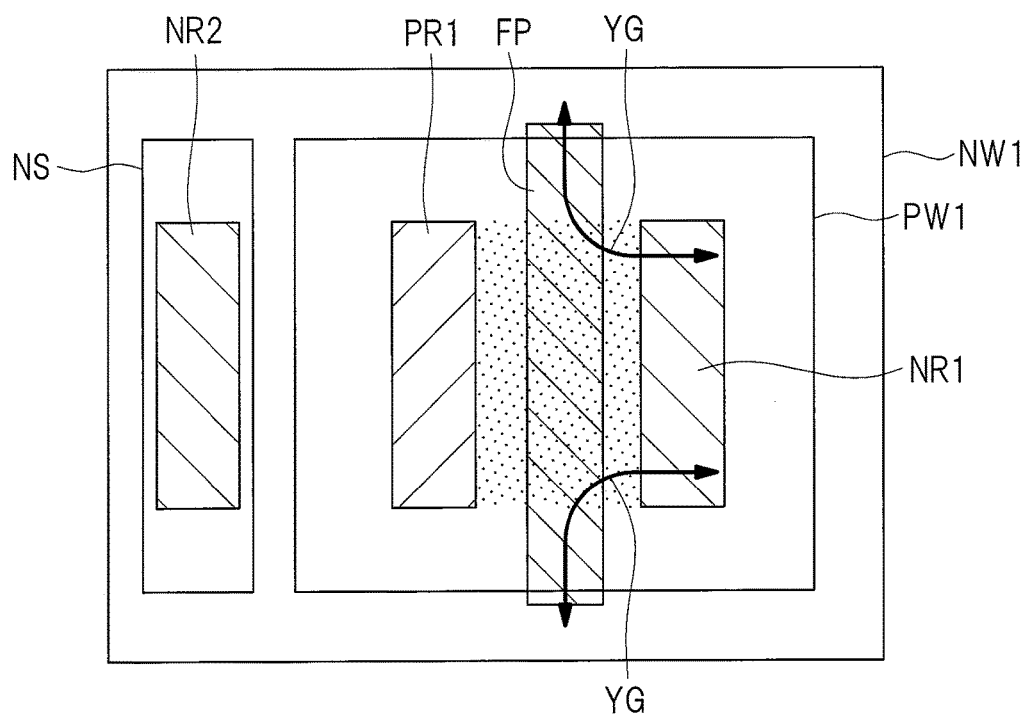
FIG. 35 is a plan view of a main part of a semiconductor device according to a first modified example.

First, a description will be given regarding a first modified example. FIG. 35 is a plan view of a main part illustrating a semiconductor device according to the first modified example of the present embodiment and corresponds to FIG. 2. Similarly to FIG. 2, the p$^+$-type semiconductor region PR1, the n$^+$-type semiconductor region NR1, the n$^+$-type semiconductor region NR2, and the electrode FP are hatched by fine oblique lines also in FIG. 35 for easy understanding.

A difference of the semiconductor device according to the first modified example illustrated in FIG. 35 from the semiconductor device of FIGS. 1 to 3 is a region (range) in which the electrode FP is formed, and the semiconductor device according to the first modified example illustrated in FIG. 35 is also basically the same as the semiconductor device of FIGS. 1 to 3 except for the difference described above.

That is, it is common in both cases of FIG. 2 and the first modified example of FIG. 35 that the electrode FP is formed on the element isolation region LS between the n$^+$-type emitter semiconductor region NR1 and the p$^+$-type base semiconductor region PR1 when seen in a plan view and at least a part of the electrode FP is buried in the trench TR formed in the element isolation region LS.

However, in the case of FIG. 2, when seen in a plan view, the entire electrode FP is formed (settled) in a region between the n$^+$-type emitter semiconductor region NR1 and the p$^+$-type base semiconductor region PR1. In contrast, in the case of the first modified example of FIG. 35, when seen in a plan view, a part of the electrode FP protrudes from the region between the n$^+$-type emitter semiconductor region NR1 and the p$^+$-type base semiconductor region PR1, and a part (end portion) of the electrode FP is overlapped with the n-type well NW1 when seen in a plan view. Here, FIG. 35 illustrates the region between the n$^+$-type emitter semiconductor region NR1 and the p$^+$-type base semiconductor region PR1 when seen in a plan view with dotted hatching.

Also in the case of the first modified example of FIG. 35, similarly to the case of FIG. 2, it is possible to obtain the effects of mitigating the electric field concentration by the presence of the electrode FP and suppressing the generation of the hot carrier when the reverse bias is applied between the emitter and the base, and accordingly, it is possible to improve the reliability of the semiconductor device. The reason thereof is the same as described above.

However, the case of FIG. 2 is more effective than the case of the first modified example of FIG. 35 in terms of the following points.

That is, as compared to the case of FIG. 2, the case of the first modified example of FIG. 35 has a risk of leakage which is likely to occur between the n$^+$-type emitter semiconductor region NR1 and the n-type collector well NW1 via an inversion layer (an n-type inversion layer) of the surface layer portion of the p-type well PW1 in a path indicated by an arrow YG. This is because there is a risk that the inversion layer is formed in the surface layer portion of the p-type well PW1 in the region immediately below the electrode FP when a voltage is applied to the electrode FP, and the leakage is likely to occur between the n$^+$-type emitter semiconductor region NR1 and the n-type collector well NW1 via the inversion layer when the inversion layer is formed.

Thus, it is preferable that the electrode FP not be overlapped with the n-type well NW1 when seen in a plan view. Accordingly, even if the inversion layer is formed in the surface layer portion of the p-type well PW1 in the region immediately below the electrode FP, the inversion layer is spaced apart from the n-type well NW1, and thus, the leakage hardly occurs between the n$^+$-type emitter semiconductor region NR1 and the n-type collector well NW1 via the inversion layer. Thus, it is possible to suppress or prevent the occurrence of the leakage between the n$^+$-type emitter semiconductor region NR1 and the n-type collector well NW1 via the inversion layer of the surface layer portion of the p-type well PW1, and as a result, it is possible to further improve the reliability of the semiconductor device.

In addition, when seen in a plan view, it is preferable that the electrode FP should not protrude from the region between the n$^+$-type, emitter semiconductor region NR1 and the p$^+$-type base semiconductor region PR1 (the region with the dotted hatching in FIG. 35). That is, when seen in a plan view, it is preferable that the entire electrode FP be formed (settled) in the region between the n$^+$-type emitter semiconductor region NR1 and the p$^+$-type base semiconductor region PR1. The reason is that it is the electrode FP of the part positioning between the n$^+$-type emitter semiconductor region NR1 and the p$^+$-type base semiconductor region PR1 when seen in a plan view that has the action to mitigate the electric field concentration at the time of applying the reverse bias between the emitter and the base. In FIG. 35, the electrode FP of the part protruding from the region between the n$^+$-type emitter semiconductor region NR1 and the p$^+$-type base semiconductor region PR1 when seen in a plan view has a relatively little action of mitigating the electric field and has a risk of forming the inversion layer which becomes the leakage path. Thus, when seen in a plan view, it is preferable to form the electrode FP not to protrude from the region between the n$^+$-type emitter semiconductor region NR1 and the p$^+$-type base semiconductor region PR1. Accordingly, it is possible to further appropriately suppress or prevent the leakage from occurring between the n$^+$-type emitter semiconductor region NR1 and the n-type collector well NW1 via the inversion layer of the surface layer portion of the p-type well PW1 while maintaining the action of mitigating the electric field concentration when the reverse bias is applied between the emitter and the base. Thus, it is possible to further improve the reliability of the semiconductor device.

Accordingly, as compared to the case of the first modified example of FIG. 35, the case of FIG. 2 is more preferable since it is easy to suppress or prevent the leakage from occurring between the n$^+$-type emitter semiconductor region NR1 and the n-type collector well NW1 via the inversion layer of the surface layer portion of the p-type well PW1.

In addition, in the case of the first modified example of FIG. 35, a dimension of the electrode FP in parallel to the main surface of the semiconductor substrate SUB and in a direction (vertical direction of FIG. 35) substantially perpendicular to an opposing direction (lateral direction of FIG. 35) of the n$^+$-type semiconductor region NR1 and the p$^+$-type semiconductor region PR1 is set to be larger than those of the n$^+$-type semiconductor region NR1 and the p$^+$-type semiconductor region PR1. Further, when seen in a plan view, the electrode FP is disposed between the n$^+$-type semiconductor region NR1 and the p$^+$-type semiconductor region PR1. Thus, a part of the electrode FP protrudes from a region between the n$^+$-type semiconductor region NR1 and the p$^+$-type semiconductor region PR1.

In contrast, in the case of FIG. 2, a dimension of the electrode FP (the trench TR) in parallel to the main surface of the semiconductor substrate SUB and in a direction (vertical direction of FIG. 2) substantially perpendicular to an opposing direction (lateral direction of FIG. 2) of the n$^+$-type semiconductor region NR1 and the p$^+$-type semiconductor region PR1 is set to be substantially the same as both or either one of the n$^+$-type semiconductor region NR1 and the p$^+$-type semiconductor region PR1. Further, when seen in a plan view, the electrode FP is disposed between the n$^+$-type semiconductor region NR1 and the p$^+$-type semiconductor region PR1. Thus, it is possible to prevent the electrode FP from protruding from a region between the n$^+$-type semiconductor region NR1 and the p$^+$-type semiconductor region PR1 while securing the mitigation effect of the electric field according to the electrode FP, and to suppress or prevent the leakage from occurring between the n$^+$-type semiconductor region NR1 and the n-type well NW1 via the inversion layer of the p-type well PW1.

Figure 36:
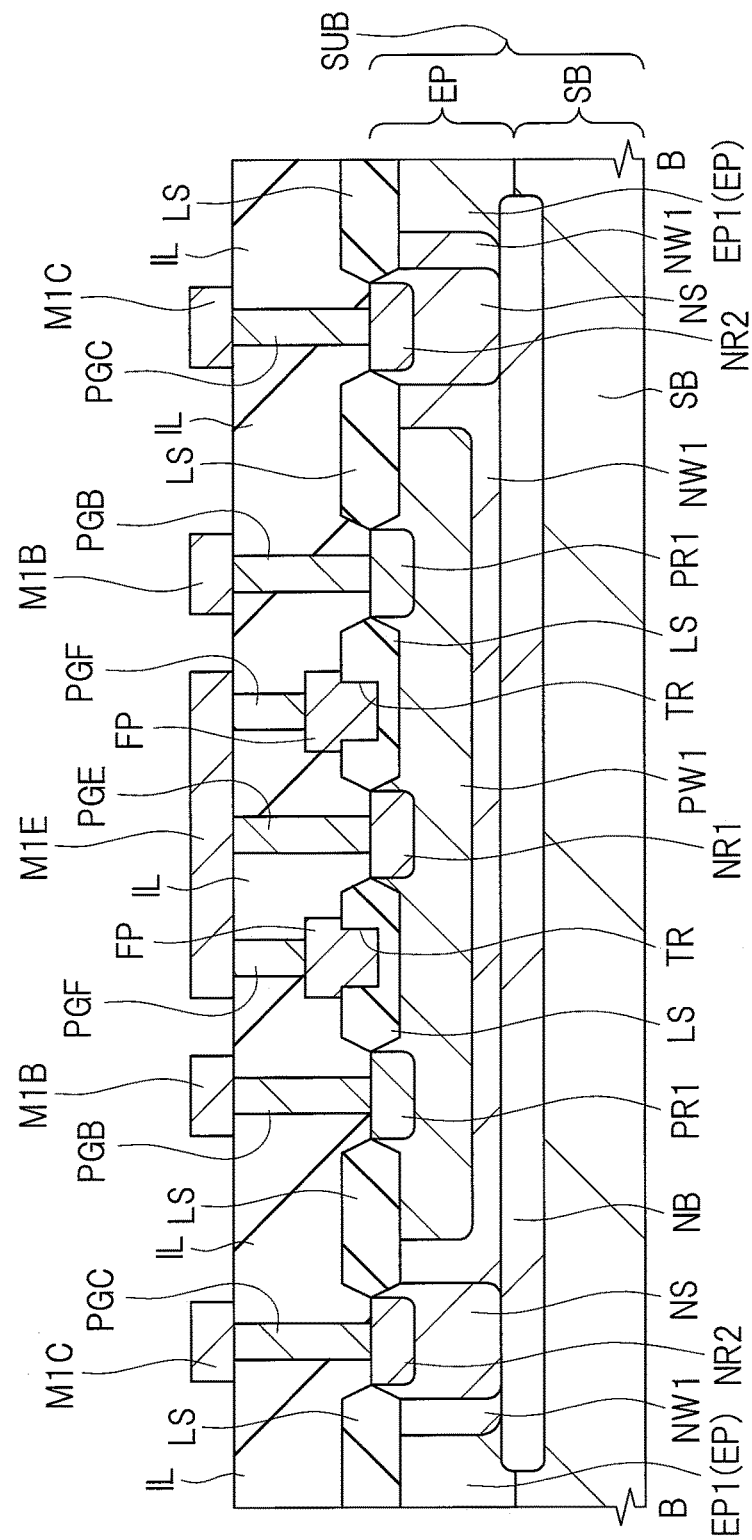
FIG. 36 is a plan view of a main part of a semiconductor device according to a second modified example.
Figure 37:
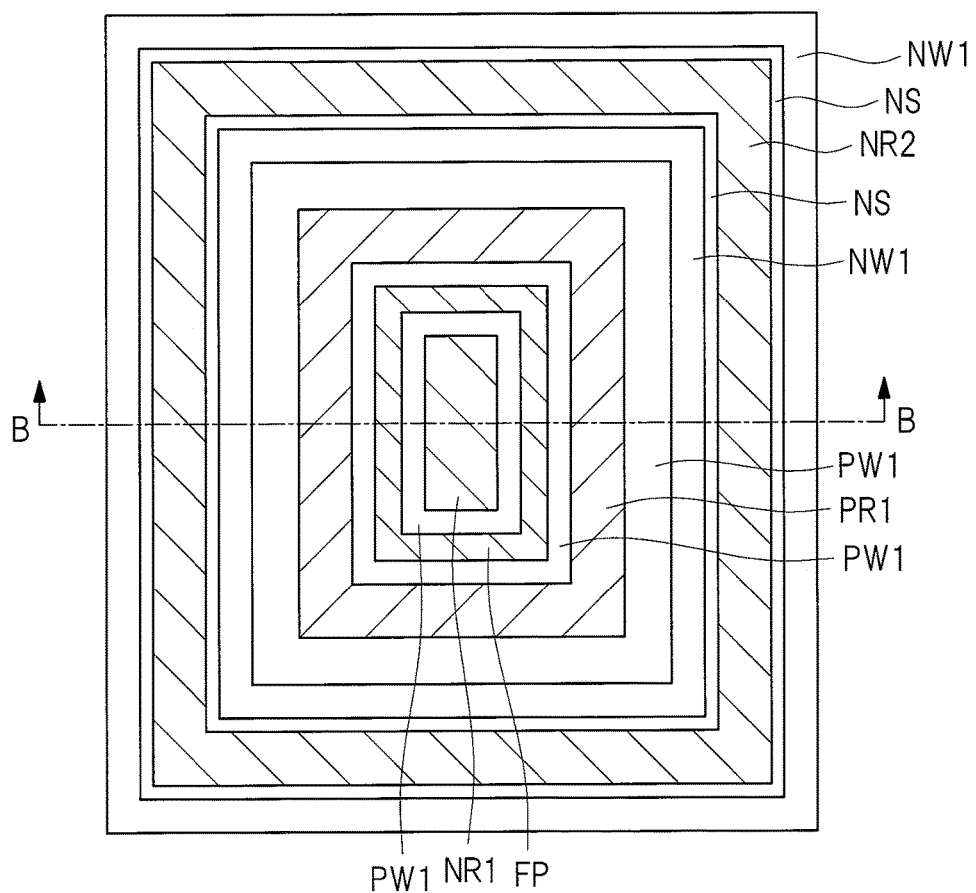
FIG. 37 is a plan view of the main part of the semiconductor device according to the second modified example.

Next, a description will be given regarding a second modified example. FIG. 36 is a cross-sectional view of a main part illustrating a semiconductor device according to the second modified example of the present embodiment, and FIG. 37 is a plan view of the main part illustrating the semiconductor device according to the second modified example of the present embodiment. FIG. 36 corresponds to FIG. 1, and FIG. 37 corresponds to FIG. 2. Similarly to FIG. 2, the p$^+$-type semiconductor region PR1, the n$^+$-type semiconductor region NR1, the n$^+$-type semiconductor region NR2, and the electrode FP are hatched by fine oblique lines also in FIG. 37 for easy understanding. A cross-sectional view taken along a line B-B of FIG. 37 substantially corresponds to FIG. 36.

In the semiconductor device according to the second modified example of FIGS. 36 and 37, when seen in a plan view, the p$^+$-type base semiconductor region PR1 is formed so as to surround the n$^+$-type emitter semiconductor region NR1, and the n$^+$-type collector semiconductor region NR2 is formed so as to surround the p$^+$-type base semiconductor region PR1 and the p-type well PW1. The n$^+$-type sinker region NS is also formed so as to surround the p$^+$-type base semiconductor region PR1 and the p-type well PW1. Further, when seen in a plan view, the electrode FP is formed on the element isolation region LS between the p$^+$-type semiconductor region PR1 and the n$^+$-type semiconductor region NR1 and is formed so as to surround the n$^+$-type emitter semiconductor region NR1.

That is, the semiconductor device according to the second modified example of FIGS. 36 and 37 is also the same as the semiconductor device of FIGS. 1 to 3 described above in terms of the points that the element isolation region LS is formed on the main surface of the semiconductor substrate SUB between the p$^+$-type base semiconductor region PR1 and the n$^+$-type emitter semiconductor region NR1, the electrode FP is formed on the element isolation region LS, a part of the electrode FP is buried in the trench TR formed in the element isolation region LS. However, in the case of the semiconductor device according to the second modified example of FIGS. 36 and 37, the electrode FP is formed so as to surround the n$^+$-type emitter semiconductor region NR1 between, the p$^+$-type base semiconductor region PR1 and the n$^+$-type emitter semiconductor region NR1 when seen in a plan view by reflecting that the p$^+$-type base semiconductor region PR1 is formed so as to surround the n$^+$-type emitter semiconductor region NR1. The trench TR configured to allow the electrode FP to be buried therein is also formed so as to surround the n$^+$-type emitter semiconductor region NR1 between the p$^+$-type base semiconductor region PR1 and the n$^+$-type emitter semiconductor region NR1, when seen in a plan view.

The other configurations of the semiconductor device according to the second modified example of FIGS. 36 and 37 are substantially the same as those of the semiconductor device of FIGS. 1 to 3 described above, and thus, the repetitive description thereof will be omitted here.

Similarly to the semiconductor device of FIGS. 1 to 3, it is possible to obtain the effects of mitigating the electric field concentration by the presence of the electrode FP and suppressing the generation of the hot carrier when the reverse bias is applied between the emitter and the base also in the semiconductor device according to the second modified example of FIGS. 36 and 37, and accordingly, it is possible to improve the reliability of the semiconductor device. Since the reason thereof is the same as described above, the repetitive description thereof will be omitted here.

(Second Embodiment)

Figure 38:
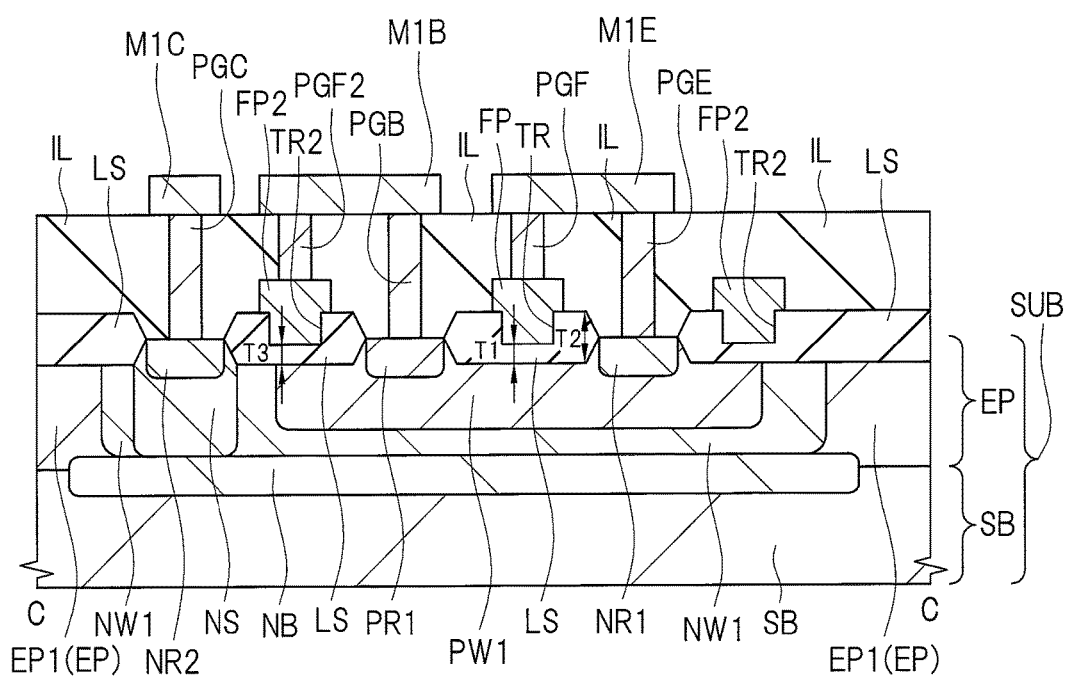
FIG. 38 is a cross-sectional view of a main part of a semiconductor device according to another embodiment.
Figure 39:
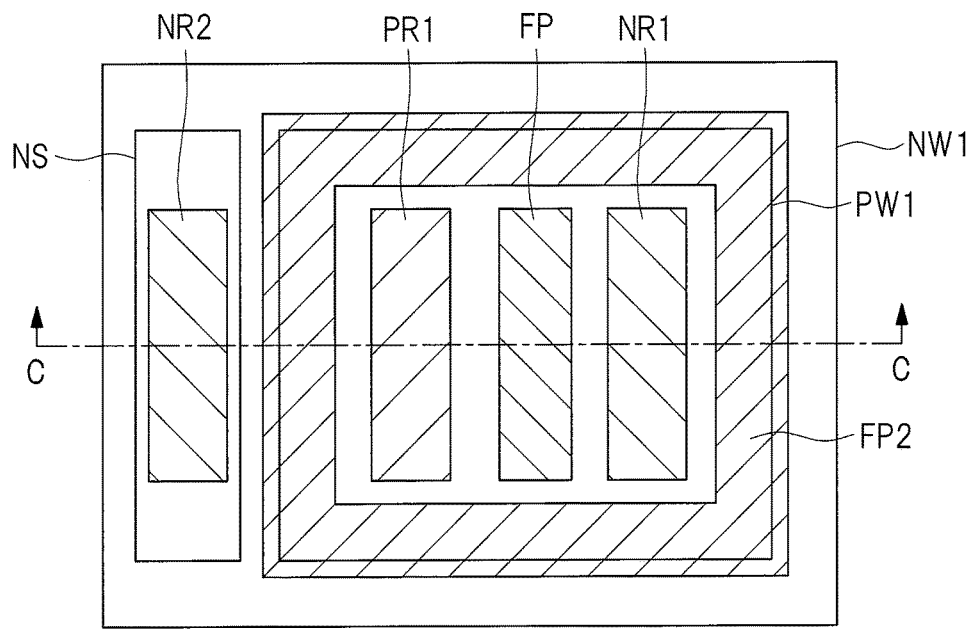
FIG. 39 is a cross-sectional view of the main part of the semiconductor device according to another embodiment.
Figure 40:
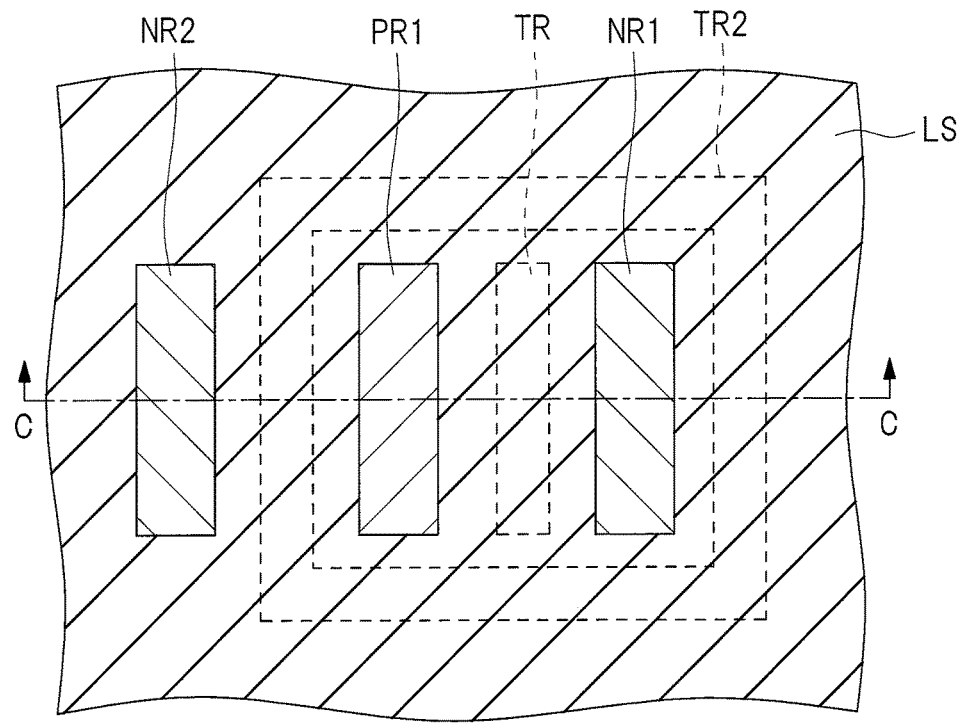
FIG. 40 is a cross-sectional view of the main part of the semiconductor device according to another embodiment.

FIG. 38 is a cross-sectional view of a main part of a semiconductor device according to a second embodiment, and FIGS. 39 and 40 are plan views of the main part of the semiconductor device of the second embodiment. FIG. 38 corresponds to FIG. 1, FIG. 39 corresponds to FIG. 2, and FIG. 40 corresponds to FIG. 3. FIGS. 39 and 40 illustrate the same planar region. For easy understanding, in FIG. 39, the p$^+$-type semiconductor region PR1, the n$^+$-type semiconductor region NR1, the n$^+$-type semiconductor region NR2, the electrode FP, and an electrode FP2 are hatched by fine oblique lines, and in FIG. 40, the p$^+$-type semiconductor region PR1, the n$^+$-type semiconductor region NR1, and the n$^+$-type semiconductor region NR2 are hatched by fine oblique lines as well as the element isolation region LS is hatched by thick oblique lines. In addition, FIG. 40 illustrates positions of the trenches TR and TR2 which are formed in the element isolation region LS using dotted lines. A cross-sectional view taken along a line C-C of FIGS. 39 and 40 substantially corresponds to FIG. 38.

A difference of the semiconductor device of the second embodiment illustrated in FIGS. 38 to 40 from the semiconductor device of the first embodiment is that the electrode FP2, the trench TR2, and a plug PGF2 are provided. Here, a description will be given by focusing on the difference between the semiconductor device of the second embodiment and the semiconductor device of the first embodiment.

The element isolation region LS is formed in the main surface of the semiconductor substrate SUB so as to surround the n$^+$-type semiconductor region NR1, the p$^+$-type semiconductor region PR1, and the n$^+$-type semiconductor region NR2 when seen in a plan view, and further, not only the above-described electrode FP but also the electrode FP2 are formed on the element isolation region LS in this second embodiment. A configuration of the electrode FP of this second embodiment is basically the same as that of the first embodiment, and the repetitive description thereof will be omitted here.

At least a part of the electrode FP2 is buried in the trench TR2 formed in the element isolation region LS. The trench TR2 is formed in the same process with the trench TR. In addition, the electrode FP2 is formed in the same process with the electrode FP, and it is possible to form the electrode FP2 and the electrode FP using the common conductive film (corresponding to the above-described silicon film PS). For example, it is possible to form the electrode FP, the electrode FP2, and the gate electrodes GE1 and GE2 described above by patterning the silicon film PS.

However, the electrode FP2 and the electrode FP are separated from each other and are not electrically connected. Thus, it is possible to supply potentials different from each other to the electrode FP2 and the electrode FP. It is possible to regard each of the electrodes FP and FP2 as the field plate electrode.

The interlayer insulating film IL is formed on the main surface of the semiconductor substrate SUB so as to cover the element isolation region LS and the electrodes FP and FP2, and the plug PGF2 is formed on the electrode FP2 as the plug PG which is buried in the interlayer insulating film IL. The plug PGF2 is disposed on the electrode FP2 and is electrically connected to the electrode FP2. While the plug PGF2 is electrically connected to the electrode FP2 as a bottom surface thereof is in contact with the electrode FP2, in a case in which the metal silicide layer is formed on the electrode FP2, the plug PGF2 is in contact with the metal silicide layer on the electrode FP2 and is electrically connected to the electrode FP2 via the metal silicide layer.

In this second embodiment, the base plug PGB and the plug PGF2 are electrically connected to each other and specifically are electrically connected to each other via the base wire M1B. The base wire M1B extends on the interlayer insulating film IL including on the base plug PGB and on the plug PGF2 and is overlapped with the base plug PGB and the plug PGF2 when seen in a plan view. The base plug PGB and the base wire M1B are electrically connected to each other as the upper surface of the base plug PGB is in contact with the base wire M1B, and the plug PGF2 and the base wire M1B are electrically connected to each other as an upper surface of the plug PGF2 is in contact with the base wire M1B. Thus, the base wire M1B is electrically connected to the p$^+$-type semiconductor region PR1 via the base plug PGB and is electrically connected to the electrode FP2 via the plug PGF2.

The base plug PGB is connected to the base wire M1B, and the plug PGF2 is also connected to the base wire M1B. That is, each of the electrode FP2 and the p$^+$-type base semiconductor region PR1 is electrically connected to the common base wire M1B via the plug PG. In other words, the electrode FP2 and the p$^+$-type base semiconductor region PR1 are electrically connected to each other via the plug PGF2, the base wire M1B and the base plug PGB. Thus, a desired base voltage is supplied from the base wire M1B to the p$^+$-type base semiconductor region PR1 via the base plug PGB, and further, a voltage which is the same as the base voltage is supplied from the base wire M1B to the electrode FP2 via the plug PGF2. Accordingly, the same voltage (base voltage) is supplied to the electrode FP2 and the p$^+$-type base semiconductor region PR1, and both have substantially the same potential. In other words, the electrode FP2 is fixed to the same potential as the p$^+$-type base semiconductor region PR1. Meanwhile, similarly to the first embodiment, the electrode FP is fixed to the same potential as the n$^+$-type emitter semiconductor region NR1 also in this second embodiment.

When seen in a plan view, the electrode FP2 surrounds the n$^+$-type emitter semiconductor region NR1, the p$^+$-type base semiconductor region PR1, and the electrode FP and is formed to be overlapped with the p-type well PW1. That is, when seen in a plan view, the electrode FP2 is formed such that an overlapping region between the electrode FP2 and the p-type well PW1 surrounds the n$^+$-type emitter semiconductor region NR1, the p$^+$-type base semiconductor region PR1, and the electrode FP. In other words, the electrode FP2 (or the overlapping region between the electrode FP2 and the p-type well PW1) has an annular shape when seen in a plan view, and the n$^+$-type emitter semiconductor region NR1, the p$^+$-type base semiconductor region PR1, and the electrode FP are disposed at an inner side of the annular electrode FP2. Here, regarding a planar shape of the electrode FP2, the case in which the outer shape thereof is quadrangular and annular is illustrated, and the outer shape of the electrode FP2 may be formed to be circular and annular, polygonal and annular, or annular with any other shape.

In addition, when seen in a plan view, it is preferable that the trench TR2 be formed to surround the n$^+$-type emitter semiconductor region NR1, the p$^+$-type base semiconductor region PR1, and the electrode FP and is overlapped with the p-type well PW1. That is, when seen in a plan view, it is preferable that the trench TR2 be formed such that an overlapping region between the trench TR2 and the p-type well PW1 surrounds the n$^+$-type emitter semiconductor region NR1, the p$^+$-type base semiconductor region PR1, and the electrode FP. In other words, it is preferable that the trench TR2 (or the overlapping region between the trench TR2 and the p-type well PW1) have an annular shape when seen in a plan view and that the n$^+$-type emitter semiconductor region NR1, the p$^+$-type base semiconductor region PR1, and the electrode FP be disposed at an inner side of the annular trench TR2.

In addition, preferably, when seen in a plan view, the electrode FP2 is not formed between the n$^+$-type semiconductor region NR1 and the electrode FP and between the p$^+$-type semiconductor region PR1 and the electrode FP but is formed so as to surround the n$^+$-type semiconductor region NR1, the electrode FP, and the p$^+$-type semiconductor region PR1.

In addition, when seen in a plan view, there may be a case in which the electrode FP2 surrounds the n$^+$-type semiconductor region NR1, the electrode FP, and the p$^+$-type semiconductor region PR1 not in a continuous manner but in an intermittent manner, but it is more preferable that the electrode FP2 continuously surround the n$^+$-type semiconductor region NR1, the electrode FP, and the p$^+$-type semiconductor region PR1. That is, when seen in a plan view, it is preferable that the electrode FP2 be continuously provided around (as one round) the n$^+$-type semiconductor region NR1, the electrode FP, and the p$^+$-type semiconductor region PR1. Accordingly, it is possible to enhance the effect of suppressing the leakage which occurs between the n$^+$-type emitter semiconductor region NR1 and the n-type collector well NW1 according to the electrode FP2.

The other configurations of the semiconductor device of the second embodiment are substantially the same as those of the semiconductor device of the first embodiment described above, and thus, the repetitive description thereof will be omitted here.

Also in this second embodiment, similarly to the first embodiment, it is possible to obtain the effects of mitigating the electric field concentration and suppressing the generation of the hot carrier by providing the electrode FP when the reverse bias is applied between the emitter and the base, and accordingly, it is possible to improve the reliability of the semiconductor device. Since the reason thereof is the same as the first embodiment described above, the repetitive description thereof will be omitted here.

In addition, in this second embodiment, it is possible to suppress or prevent the leakage from occurring between the n$^+$-type emitter semiconductor region NR1 and the n-type collector well NW1 via the inversion layer of the surface layer portion of the p-type well PW1 by forming the electrode FP2, and thus, it is possible to further improve the reliability of the semiconductor device. Hereinafter, such a point will be described in detail.

That is, the electrode FP2 is provided in this second embodiment. This electrode FP2 is provided such that the inversion layer (the n-type inversion layer) is not formed in the surface layer portion of the p-type well PW1. If an inversion layer is formed in the surface layer portion of the p-type well PW1, the leakage is likely to occur between the n$^+$-type emitter semiconductor region NR1 and the n-type collector well NW1 via the inversion layer. In addition, it is effective to lower the p-type impurity concentration of the p-type base well PW1 in order to enhance the hFE characteristic, but in such a case, the inversion layer is likely to be formed in the surface layer portion of the p-type well PW1. Further, if an inversion layer is formed in the surface layer portion of the p-type well PW1 in a case in which a high voltage is applied to a wire at an upper layer than the wire M1 or the like, there is a risk that leakage occurs between the n$^+$-type emitter semiconductor region NR1 and the n-type collector well NW1 via the inversion layer.

In this second embodiment, it is configured such that the electrode FP2 is electrically connected to the p$^+$-type base semiconductor region PR1 via the plug PGF2, the base wire M1B, and the base plug PGB so that the same potential as the p$^+$-type base semiconductor region PR1 is supplied also to the electrode FP2, and thus, the inversion layer is hardly formed in the surface layer portion of the p-type well PW1 immediately below the electrode FP2. For example, even in a case in which a high voltage is applied to the wire at the upper layer than the wire M1, since the electrode FP2 is fixed to the base voltage, the inversion layer is hardly formed in the surface layer portion of the p-type well PW1 immediately below the electrode FP2. Thus, it is possible to suppress or prevent the leakage from occurring between the $n^+$-type emitter semiconductor region NR1 and the n-type collector well NW1 via the inversion layer of the surface layer portion of the p-type well PW1 by forming the electrode FP2.

In addition, it is preferable that the electrode FP2 be formed so as to surround the $n^+$-type emitter semiconductor region NR1, the electrode FP, and the $p^+$-type base semiconductor region PR1 and to be overlapped with the p-type well PW1 when seen in a plan view. From another viewpoint, when seen in a plan view, it is preferable that the overlapping region between the electrode FP2 and the p-type well PW1 surround the $n^+$-type emitter semiconductor region NR1, the electrode FP, and the $p^+$-type base semiconductor region PR1. Accordingly, when seen in a plan view, the $n^+$-type emitter semiconductor region NR1 and the $p^+$-type base semiconductor region PR1 are surrounded by the region (the region immediately below the electrode FP2) in which the inversion layer is hardly formed in the p-type well PW1. Thus, the leakage between the $n^+$-type emitter semiconductor region NR1 and the n-type collector well NW1 via the inversion layer of the surface layer portion of the p-type well PW1 can be appropriately suppressed or prevented.

Further, in this second embodiment, since at least a part of the electrode FP2 is buried in the trench TR2 of the element isolation region LS, it is possible to reduce a thickness T3 of the element isolation region LS immediately below the electrode FP2 of the part buried in the trench TR2 while securing the thickness (T2) of the element isolation region LS outside the trenches TR and TR2. Here, the thickness T3 is illustrated in FIG. 38, the thickness T3 corresponds to the thickness of the element isolation region LS in a bottom portion of the trench TR2, the thickness T2 corresponds to the thickness of the element isolation region LS outside the trenches TR and TR2, and a difference between the thickness T2 and the thickness T3 (that is, T2−T3) corresponds to a depth of the trench TR2.

Accordingly, it is possible to reduce a distance (interval) between the electrode FP2 and the p-type well PW1, and thus, it is possible to further improve the effect of causing the inversion layer to be hardly formed in the surface layer portion of the p-type well PW1 immediately below the electrode FP2. Accordingly, it is possible to further improve the effect of suppressing or preventing the leakage from occurring between the $n^+$-type emitter semiconductor region NR1 and the n-type collector well NW1 via the inversion layer of the surface layer portion of the p-type well PW1 by burying the electrode FP2 in the trench TR2 formed in the element isolation region LS. Accordingly, it is possible to further improve the reliability of the semiconductor device.

It is possible to reduce the number of the manufacturing processes when the trench TR2 is formed in the same process as the trench TR, which is more preferable. In this case, it is possible to set the depth of the trench TR2 to be the same as the depth of the trench TR. Thus, it is possible to set the thickness T3 and the thickness T1 to be the same.

In addition, it is possible to form the electrode FP2 and the electrode FP in the same process using the common conductive film (the above-described silicon film PS), and thus, it is possible to suppress the number of the manufacturing processes of the semiconductor device.

In the foregoing, although the invention made by the inventor of the present invention has been concretely described based on the embodiments thereof, it is needless to say that the present invention is not limited to the foregoing embodiments and various modifications and alterations can be made within the scope of the present invention.

What is claimed is:

1. A semiconductor device provided with a bipolar transistor, comprising:
    a semiconductor substrate;
    a first semiconductor region of a first conductivity type which is disposed in the semiconductor substrate;
    a second semiconductor region of the first conductivity type and a third semiconductor region of a second conductivity type opposite to the first conductivity type which are disposed to be spaced apart from each other in the first semiconductor region;
    an element isolation insulating film which is disposed on a main surface of the semiconductor substrate between the second semiconductor region and the third semiconductor region;
    a first electrode which is disposed on the element isolation insulating film;
    an interlayer insulating film which is disposed on the semiconductor substrate so as to cover the element isolation insulating film and the first electrode; and
    a first plug, a second plug, and a third plug which are buried in the interlayer insulating film,
    wherein an impurity concentration of the second semiconductor region is higher than an impurity concentration of the first semiconductor region,
    wherein the first semiconductor region and the second semiconductor region are base semiconductor regions of the bipolar transistor,
    wherein the third semiconductor region is an emitter semiconductor region of the bipolar transistor,
    wherein the first plug is disposed on the third semiconductor region and is electrically connected to the third semiconductor region,
    wherein the second plug is disposed on the first electrode and is electrically connected to the first electrode,
    wherein the third plug is disposed on the second semiconductor region and is electrically connected to the second semiconductor region,
    wherein the first plug and the second plug are electrically connected,
    wherein the first electrode is disposed between the second semiconductor region and the third semiconductor region in a plan view,
    wherein at least a part of the first electrode is buried in a first trench which is disposed in the element isolation insulating film,
    wherein the first trench is disposed between the second semiconductor region and the third semiconductor region in the plan view,
    wherein the semiconductor device further comprises:
    a fourth semiconductor region of the second conductivity type which is disposed in the semiconductor substrate so as to enclose the first semiconductor region;
    a fifth semiconductor region of the second conductivity type which is disposed in the fourth semiconductor region spaced apart from the first semiconductor region; and
    a fourth plug which is buried in the interlayer insulating film, wherein the fourth semiconductor region and the fifth semiconductor region are collector semiconductor regions of the bipolar transistor, and wherein the fourth plug is disposed on the fifth semiconductor region and is electrically connected to the fifth semiconductor region.

2. The semiconductor device according to claim 1, wherein the first semiconductor region extends below the element isolation insulating film between the second semiconductor region and the third semiconductor region.

3. The semiconductor device according to claim 1, further comprising:

a first wire and a second wire which are disposed on the interlayer insulating film, wherein the first wire is electrically connected to the third semiconductor region via the first plug and is electrically connected to the first electrode via the second plug, and the second wire is electrically connected to the second semiconductor region via the third plug.

4. The semiconductor device according to claim 1, wherein a thickness of the element isolation insulating film immediately below the part of the first electrode buried in the first trench is less than a thickness of the element isolation insulating film in a region in which the first trench is not formed.

5. The semiconductor device according to claim 4, wherein the thickness of the element isolation insulating film immediately below the part of the first electrode buried in the first trench is equal to or less than half of the thickness of the element isolation insulating film in the region in which the first trench is not formed.

6. The semiconductor device according to claim 4, wherein the thickness of the element isolation insulating film immediately below the part of the first electrode buried in the first trench is equal to or greater than 50 nm.

7. The semiconductor device according to claim 4, wherein the thickness of the element isolation insulating film immediately below the part of the first electrode buried in the first trench is 50 to 200 nm.

8. The semiconductor device according to claim 1, wherein the element isolation insulating film is an LOCOS oxide film or an STI insulating film.

9. The semiconductor device according to claim 1, wherein an impurity concentration of the fifth semiconductor region is higher than an impurity concentration of the fourth semiconductor region.

10. The semiconductor device according to claim 9, further comprising:

a buried semiconductor region of the second conductivity type which is disposed in the semiconductor substrate and is positioned below the fourth semiconductor region, wherein an impurity concentration of the buried semiconductor region is higher than an impurity concentration of the fourth semiconductor region.

11. The semiconductor device according to claim 9, further comprising:

a third wire which is disposed on the interlayer insulating film, wherein the third wire is electrically connected to the fifth semiconductor region via the fourth plug.

12. The semiconductor device according to claim 9, further comprising:

a second electrode which is disposed on the element isolation insulating film;

a fifth plug which is buried in the interlayer insulating film, wherein the element isolation insulating film is disposed on the main surface of the semiconductor substrate so as to surround the second semiconductor region, the third semiconductor region, and the fifth semiconductor region, the fifth plug is disposed on the second electrode and is electrically connected to the second electrode, the fifth plug and the third plug are electrically connected, and at least a part of the second electrode is buried in a second trench which is disposed in the element isolation insulating film.

13. The semiconductor device according to claim 12, further comprising:

a first wire and a second wire which are disposed on the interlayer insulating film, wherein the first wire is electrically connected to the third semiconductor region via the first plug and is electrically connected to the first electrode via the second plug, and the second wire is electrically connected to the second semiconductor region via the third plug and further is electrically connected to the second electrode via the fifth plug.

14. The semiconductor device according to claim 12, wherein the second electrode is disposed so as to surround the second semiconductor region, the third semiconductor region, and the first electrode, and to be overlapped with the first semiconductor region when seen in the plan view.

\* \* \* \* \*